United States Patent
Yamaguchi et al.

[11] Patent Number: 6,097,685
[45] Date of Patent: Aug. 1, 2000

[54] INFORMATION REPRODUCING APPARATUS AND REPRODUCING METHOD

[75] Inventors: Shigeo Yamaguchi; Junichi Horigome, both of Kanagawa; Takayoshi Chiba, Tokyo, all of Japan

[73] Assignee: Sony Corporation, Tokyo, Japan

[21] Appl. No.: 09/066,190

[22] Filed: Apr. 24, 1998

[30] Foreign Application Priority Data

Apr. 24, 1997 [JP] Japan ................................. 9-107476

[51] Int. Cl.[7] ....................................... G11B 7/00
[52] U.S. Cl. ............................................. 369/59
[58] Field of Search ................... 369/59, 47, 48, 369/124

[56] References Cited

U.S. PATENT DOCUMENTS 5,901,128   5/1999   Hayashi et al. ........................ 369/59

*Primary Examiner*—Nabil Hindi
*Attorney, Agent, or Firm*—Limbach & Limbach L.L.P.; Seong-Kun Oh

[57] ABSTRACT

A structure for detecting a phase error for causing a PLL of an information reproducing apparatus to be locked and for selecting Viterbi determination mode, MSB determination mode (for obtaining a phase error detection timing corresponding to MSB of output data of an A/D converter disposed on the preceding stage of a Viterbi decoder) is disclosed. One of the three modes is selected corresponding to the state of the PLL. A Viterbi timing generating circuit, an MSB timing generating circuit, and a frequency lock mode timing generating circuit are provided. Phase error detection timings generated by the three circuits are selectively supplied to a phase error detecting circuit by a sampling pulse selecting switch. The selected phase error detection timing is switched between the acquisition mode and the tracking mode.

16 Claims, 24 Drawing Sheets

Fig. 4
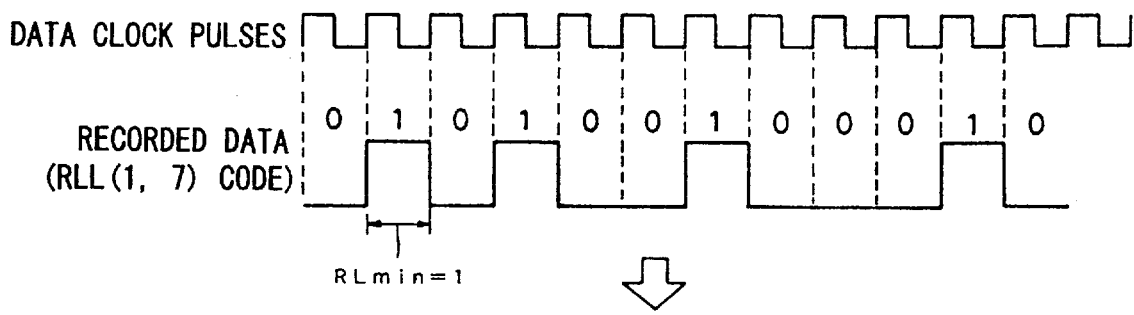
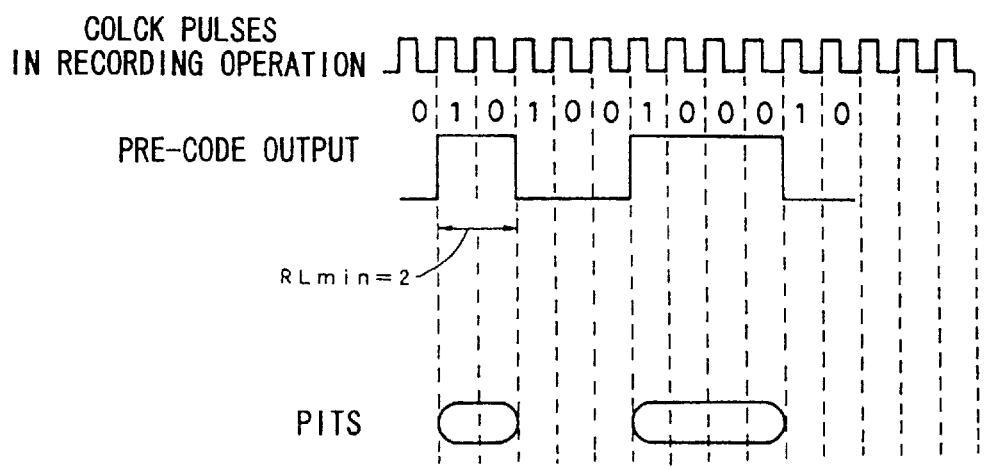

Fig. 9

| | |
|---|---|
| S3 ○──○ (arrow up-right)<br>S2 ○──→○ | $m(0, k-1)+z[k] < m(3, k-1)+\alpha * z[k] - \beta$<br>&& $m(2, k-1)-z[k] < m(1, k-1)-\alpha * z[k] - \beta$ |
| S1 ○──○ (arrow up-right)<br>S0 ○──→○ | $m(0, k) = m(0, k-1) + z[k]$<br>$m(1, k) = m(0, k-1) + \alpha * z[k] - \beta$<br>$m(2, k) = m(2, k-1) - z[k]$<br>$m(3, k) = m(2, k-1) - \alpha * z[k] - \beta$ |
| S3 ○╲╱○<br>S2 ○──→○ | $m(0, k-1)+z[k] \geq m(3, k-1)+\alpha * z[k] - \beta$<br>&& $m(2, k-1)-z[k] < m(1, k-1)-\alpha * z[k] - \beta$ |
| S1 ○╱╲○<br>S0 ○──→○ | $m(0, k) = m(3, k-1) + \alpha * z[k] - \beta$<br>$m(1, k) = m(0, k-1) + \alpha * z[k] - \beta$<br>$m(2, k) = m(2, k-1) - z[k]$<br>$m(3, k) = m(2, k-1) - \alpha * z[k] - \beta$ |
| S3 ○──○<br>S2 ○──○ | $m(0, k-1)+z[k] < m(3, k-1)+\alpha * z[k] - \beta$<br>&& $m(2, k-1)-z[k] \geq m(1, k-1)-\alpha * z[k] - \beta$ |
| S1 ○──○<br>S0 ○──→○ | $m(0, k) = m(0, k-1) + z[k]$<br>$m(1, k) = m(0, k-1) + \alpha * z[k] - \beta$<br>$m(2, k) = m(1, k-1) - \alpha * z[k] - \beta$<br>$m(3, k) = m(2, k-1) - \alpha * z[k] - \beta$ |
| S3 ○╲╱○<br>S2 ○╱╲○ | $m(0, k-1)+z[k] \geq m(3, k-1)+\alpha * z[k] - \beta$<br>&& $m(2, k-1)-z[k] \geq m(1, k-1)-\alpha * z[k] - \beta$ |
| S1 ○╲╱○<br>S0 ○╱╲○ | $m(0, k) = m(3, k-1) + \alpha * z[k] - \beta$<br>$m(1, k) = m(0, k-1) + \alpha * z[k] - \beta$<br>$m(2, k) = m(1, k-1) - \alpha * z[k] - \beta$<br>$m(3, k) = m(2, k-1) - \alpha * z[k] - \beta$ |

Fig. 20

| VMD | VM | DECODED DATA VALUE |
|---|---|---|
| 0 0 | 0 0<br>0 1 | 0<br>1 |
| 0 1 | 1 1 | 0 |
| 1 1 | 1 1<br>1 0 | 0<br>1 |
| 1 0 | 0 0 | 0 |

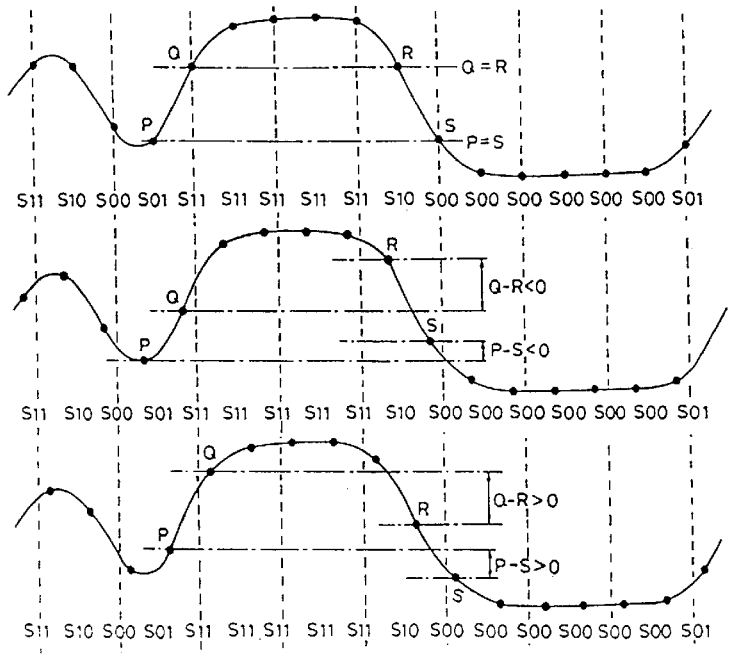
Fig. 21A
Fig. 21B
Fig. 21C
Fig. 21D VGP
Fig. 21E VGQ
Fig. 21F VGR
Fig. 21G VGS

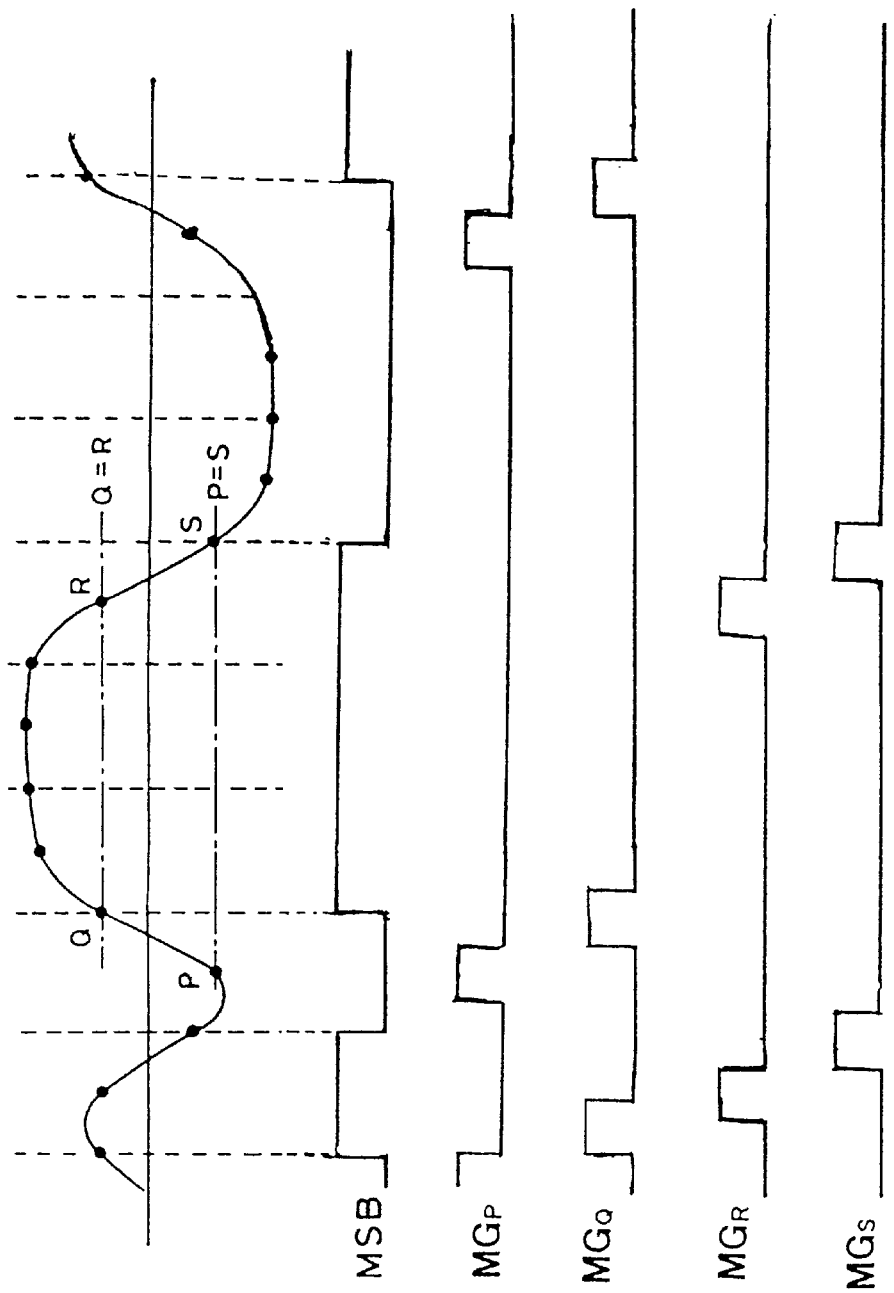

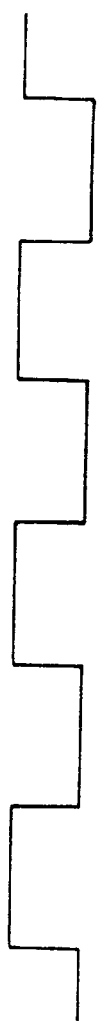
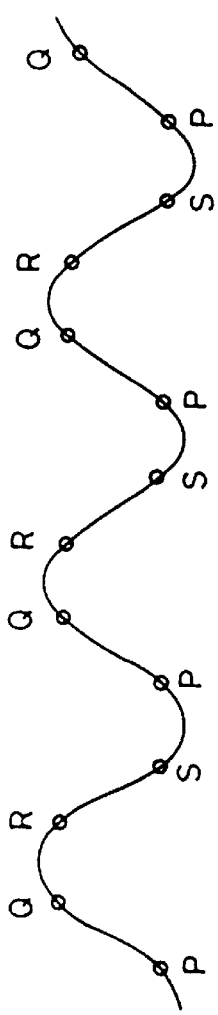
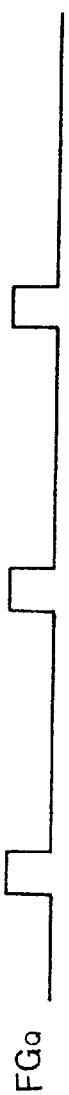
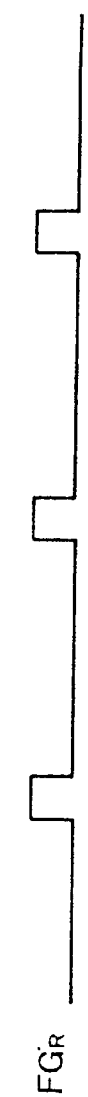
Fig. 23A  RECORDED DATA $\{a_k\}$
Fig. 23B  PRECODE OUTPUT $\{b_k\}$
Fig. 23C  2T SIGNAL
Fig. 23D  $FG_P$
Fig. 23E  $FG_Q$
Fig. 23F  $FG_R$
Fig. 23G  $FG_S$

INFORMATION REPRODUCING APPARATUS AND REPRODUCING METHOD

BACKGROUND OF THE INVENTION

1. Field of the Invention

The present invention relates to an information reproducing apparatus such as a magneto-optic disc apparatus, and a reproducing method.

2. Description of the Related Art

In an information reproducing apparatus such as a magneto-optic disc apparatus, generally, for causing a PLL (Phase Locked Loop) to be locked with a reproduced signal reproduced from a record medium, clock pulses are generated and a reproducing system is operated corresponding to that clock pulses. Therefore, it is necessary that clock pulses including no phase error or sufficiently small phase error is produced for causing a PLL to be locked adequately, so as to reproduce recorded information from record medium correctly.

It is necessary that both an acquisition mode and a tracking mode are operated adequately so as to cause a PLL constantly to be locked adequately.

When a PLL has not been caused to be locked, the PLL is caused to be locked with an acquisition mode. On the other hand, when a PLL has already caused to be locked, PLL is held to be locked with a tracking mode. A frequency lock mode has been used as an acquisition mode, and a Viterbi determination mode has been used as a tracking mode up to this time.

In a frequency lock mode, predetermined signal pattern has been recorded or formed on the predetermined area of a record media. And a PLL is caused to be locked with that predetermined signal. For example, the 5.25 inch magneto-optic disc that is up to the standardization of ISO (International Organization of Standardization), 2T (T:bit period)pattern is used as the predetermined pattern. A frequency lock mode is suitable for an acquisition mode.

On the other hand, a Viterbi determination mode can be adopted to an information reproducing apparatus that performs a Viterbi decoding process.

In a Viterbi determination mode, phase error is detected with status data, namely series of status data value that represents a status transition selected in a Viterbi decoding process. Then it is necessary that the Viterbi decoder that generates status data is used for a Viterbi determination mode to be performed. A Viterbi determination mode is suitable for a tracking mode.

A frequency lock mode and an acquisition mode have merits and demerits respectively. Therefore, PLL can be caused to be locked more stably with a structure in which these two modes are shifted over one to another in adequate timing corresponding to circumstances of a PLL. For, that structure can make up the demerits that these two modes respectively has.

OBJECTS AND SUMMARY OF THE INVENTION

Therefore, an object of the present invention is to provide an information reproducing apparatus that can generate stable clock pulses by selecting adequate mode to use as an aquisition mode and as a tracking mode respectively, from plural modes and a reproducing method.

A first aspect of the present invention is an information reproducing apparatus for causing a PLL (Phase Locked Loop) to be locked with a signal reproduced from a record medium, causing the PLL to generate a clock signal, and operating a reproducing system corresponding to the clock signal, comprising:

Viterbi decoding means for decoding the reproduced signal corresponding to the Viterbi decoding method;

first timing generating means for generating a first timing signal for detecting a phase error with status data that represents a status transition selected by the Viterbi decoding means;

second timing generating means for generating a second timing signal for detecting a phase error at a timing of the inversion of MSB of a reproduced signal with a predetermined number of bits, the reproduced signal being received from an A/D converter disposed on the preceding stage of the Viterbi decoding means;

third timing generating means for generating a third timing signal for detecting a phase error corresponding to a predetermined signal pattern recorded or formed on the predetermined area of record medium;

switching means for selectively outputting one of the first, second, and third timing signals; and phase error signal generating means for generating a phase error signal for controlling the PLL with the reproduced signal corresponding to the timing signal selected by the switching means.

A second aspect of the present invention is an information reproducing apparatus for causing a PLL to be locked with a signal reproduced from a record medium, causing the PLL to generate a clock signal, and performing a reproducing operation corresponding to the clock signal, comprising:

Viterbi decoding means for decoding the reproduced signal corresponding to Viterbi decoding method;

first timing generating means for generating a first timing signal with status data that represents a status transition selected by the Viterbi decoding means;

second timing generating means for generating a second timing signal corresponding at a timing of the inversion of MSB of the digitized reproduced signal;

switching means for selecting one of the first and second timing signals; and phase error signal generating means for generating a phase error signal for controlling the PLL with the selected timing signal.

A third aspect of the present invention is an information reproducing apparatus for causing a PLL to be locked with a signal reproduced from a record medium, causing the PLL to generate a clock signal, and performing a reproducing operation corresponding to the clock signal, comprising:

Viterbi decoding means for decoding the reproduced signal corresponding to Viterbi decoding method;

first timing generating means for generating a first timing signal with status data that represents a status transition selected by the Viterbi decoding means;

second timing generating means for generating a second timing signal corresponding to a predetermined signal pattern recorded or formed on the record medium;

switching means for selecting one of the first and second timing signals; and phase error signal generating means for generating a phase error signal for controlling the PLL with the selected timing signal.

A fourth aspect of the present invention is an information reproducing method for causing a PLL (Phase Locked Loop)

to be locked with a signal reproduced from a record medium, causing the PLL to generate a clock signal, and operating a reproducing system corresponding to the clock signal, comprising the steps of:

generating a first timing signal with status data that represents a status transition selected by a Viterbi decoder;

generating a second timing signal at a timing of the inversion of MSB of a reproduced signal with a predetermined number of bits sampled, the reproduced signal being received from an A/D converter disposed on the preceding stage of the Viterbi decoder;

generating a third timing signal with a predetermined signal pattern recorded or formed on the record medium;

selectively outputting one of the first, second, and third timing signals; and generating a phase error signal for controlling the PLL with the selected timing signal.

As an acquisition mode or as a tracking mode, adequate mode can be selected and used from three modes, namely, a Viterbi determination mode, a frequency lock mode and an MSB determination mode(this mode will be described afterward).

Therefore, demerits that these three modes respectively has can be made up in operation.

The above and other objects, features and advantage of the present invention will become readily apparent from the following detailed description thereof which is to be read in connection with the accompanying drawings.

BRIEF DESCRIPTION OF THE DRAWINGS

FIG. 4 is a schematic diagram showing that the minimum magnetizing inversion width is 2 in RLL(1, 7) code encoding method.

FIG. 9 is a schematic diagram showing a condition of a status transition corresponding to a standardized metric in the four-value four-status Viterbi decoding method.

FIG. 20 is a table that is used in an embodiment of the present invention.

FIGS. 21A–21G are schematic diagrams for explaining a method to detect a phase error in a Viterbi determination mode.

FIGS. 22A–22F are schematic diagrams for explaining a method to detect a phase error in an MSB determination mode.

FIGS. 23A–23G are block diagrams for explaining a method to detect a phase error in a frequency lock mode.

DETAILED DESCRIPTION OF THE PREFERRED EMBODIMENTS

For easy understanding of the present invention, as an example of a recording/reproducing apparatus having a reproducing system corresponding to Viterbi decoding method, the overall structure of the apparatus, the sector format of a record medium, an outline of a four-value four-status Viterbi decoding method, the structure and operation of a Viterbi decoder that accomplishes the four-value four-status Viterbi decoding method, and another Viterbi decoding method other than the four-value four-status Viterbi decoding method will be described one after the other.

[Outline of Disc Recording/Reproducing Apparatus]

Figure 1:
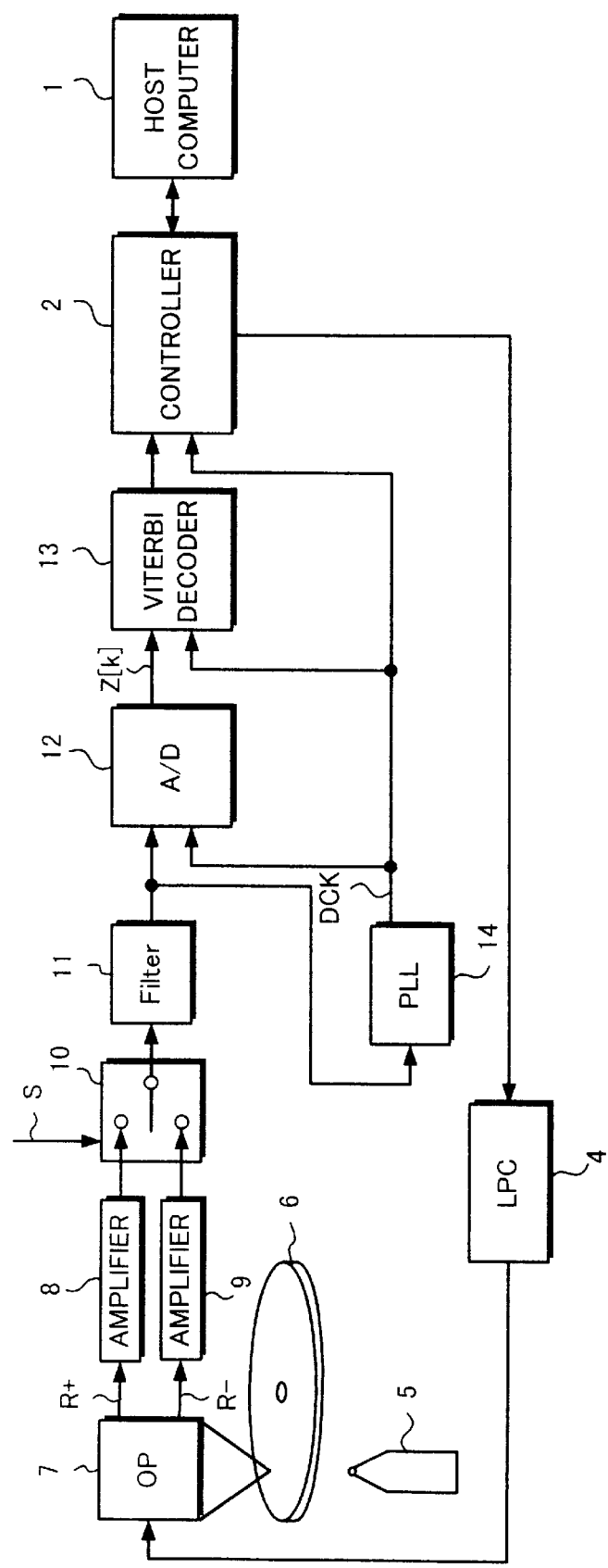
FIG. 1 is a block diagram showing the overall structure of an example of a magneto-optic disc apparatus according to the present invention.

Next, an example of a recording/reproducing apparatus having a reproducing system corresponding to the Viterbi decoding method will be described. FIG. 1 is a block diagram showing the overall structure of a magneto-optic disc apparatus having a reproducing system corresponding to the Viterbi decoding method. When a recording operation is performed, a controller 2 receives user data to be recorded corresponding to a command issued by a host computer 1 and encodes the user data as information words to RLL(1, 7) code as code words. The code words are supplied as record data to a laser power controlling portion (LPC) 4. In addition, the controller 2 performs a decoding process (that will be described later), controlling processes for a recording mode, a reproducing mode, and an erasing mode, and an communication operation with the host computer 1.

The LPC 4 controls a laser power of an optical pickup 7 corresponding to the supplied record data so as to form a pit sequence with magnetic polarities on a magneto-optic disc 6. When the data is recorded, a magnetic head 5 applies a bias magnetic field to the magneto-optic disc 6. Actually, the data is recorded in a mark edge recoding method corresponding to a pre-code output (that will be described later) generated corresponding thereto.

As will be described later, a record position (namely, a pit position) is controlled by a particular means (not shown) that aligns the magnetic head 5 and the optical pickup 7. Thus, in the recording mode, when the optical pickup 7 passes an address portion, the similar operation is performed as with the reproducing mode.

Figure 2:
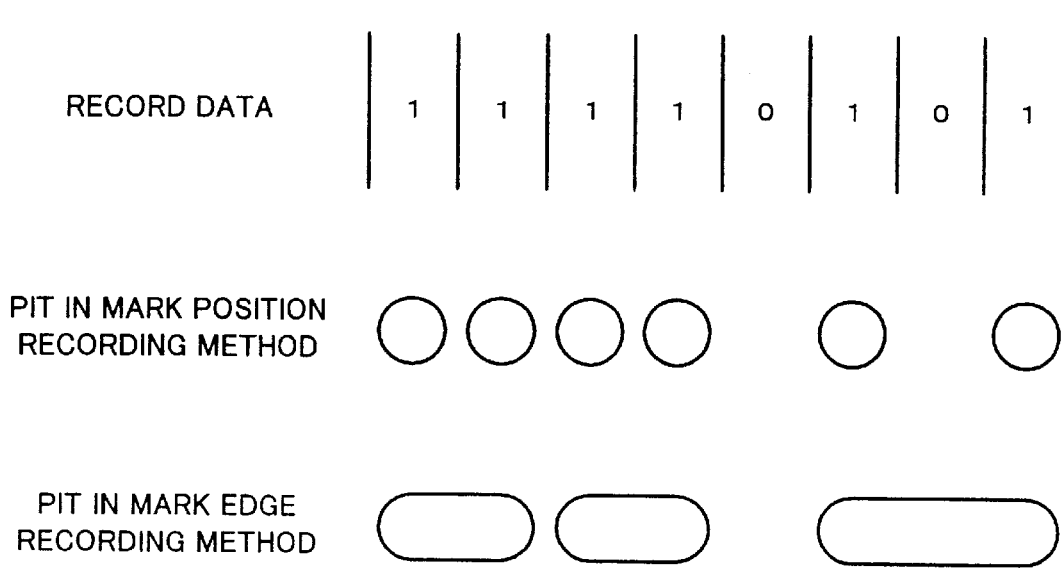
FIG. 2 is a schematic diagram for explaining a mark position recording method and a mark edge recording method.

Next, with reference to FIG. 2, a method for causing each pit formed in the above-described manner to correspond to each bit of a pre-code generated corresponding to record data will be described. A recording method of which "0" or "1" of a pre-code represents the presence or absence of a pit formed on a record medium is referred to as mark position recording, method. On the other hand, a recording method of which the inversion of the polarity at the boundary of each bit of a pre-code represents "1" is referred to as mark edge recording method. When a signal is reproduced, the boundary of each bit of a reproduced signal is recognized corresponding to a read clock pulse DCK (that will be described later).

Next, the structure and operation of the reproducing system will be described. The optical pickup 7 radiates laser light to the magneto-optic disc 6, receives the reflected light thereof, and reproduces a signal corresponding to the reflected light. The reproduced signal is composed of four signals that are a sum signal $R_+$, a difference signal $R_-$, a focus error signal, and a tracking error signal (the focus error signal and the tracking error signals are not shown). The sum signal $R_+$ is supplied to an amplifier 8. The amplifier 8 adjusts for example the gain of the sum signal $R_+$. The resultant sum signal $R_+$ is supplied to a selection switch 10. On the other hand, the difference signal $R_-$ is supplied to an amplifier 9. The amplifier 9 for example adjusts the gain of the difference signal $R_-$. The resultant difference signal $R_-$ is supplied to the selection switch 10. The focus error signal is supplied to a means (not shown) that removes a focus error. The tracking error signal is supplied to a servo system (not shown).

A selection signal S (that will be described later) is supplied to the selection switch 10. The selection switch 10 supplies the sum signal $R_+$ or the difference signal R to a filter portion 11 corresponding to the selection signal S. In other words, corresponding to a sector format of the magneto-optic disc 6, while a signal reproduced from an embossed portion is being supplied to the selection switch 10, the sum signal $R_+$ is supplied to the filter portion 11. While a signal reproduced from a magneto-optically recorded portion is being supplied to the selection switch 10, the difference signal $R_-$ is supplied to the filter portion 11.

The selection signal S is generated in the following manner. A signal that is reproduced from a predetermined pattern defined in a sector format is detected from the reproduced signal. An example of the predetermined pattern is a sector mark SM (that will be described later). When such a signal is detected, by counting the number of read clock pulses, the selection signal is generated.

The filter portion 11 is composed of a low pass filter that does not pass a noise component and a waveform equalizer that equalizes the waveform of a signal. As will be described later, the waveform equalizing characteristic in the waveform equalizing process corresponds to Viterbi decoding method of a Viterbi decoder 13. An A/D converter 12 that receives an output signal of the filter portion 11 samples a reproduced signal value z[k] corresponding to the read clock pulses DCK (that will be described later). The Viterbi decoder 13 generates decoded data with a reproduced signal value z[k] corresponding to the Viterbi decoding method. The decoded data is the maximum likelihood decoded data sequence of the recorded data. Thus, when there is no error in decoded data, the decoded data accords with the recorded data.

The decoded data is supplied to the controller 2. As described above, the recorded data is code words of which user data has been encoded by a channel-encoding process. Thus, when the error rate of decoded data is sufficiently low, the decoded data can be treated as recorded data as code words. The controller 2 performs the decoding process corresponding to the channel-encoding process for the decoded data and reproduces the user data and so forth.

Output data of the filter portion 11 is also supplied to a PLL portion 14. The PLL portion 14 generates the read clock pulses DCK corresponding to the signal received from the filter portion 11. The read clock pulses SCK are sent to the controller 2, the A/D converter 12, the Viterbi decoder 13, and so forth. The controller 2, the A/D converter 12, and the Viterbi decoder 13 operate corresponding to the read clock pulses DCK. In addition, the lead clock pulses DCK are supplied to a timing generator (not shown). The timing generator generates a signal that controls the operation timing of the apparatus such as the switching operation between the recording operation and the reproducing operation.

In the above-described reproducing operation, the operations of the individual structural portions of the reproducing system are adapted so as to obtain correct reproduced data corresponding to the signal reproduced from the magneto-optic disc 6. Such an operation is referred to as calibration. The calibration is performed for adapting parameters of the reproducing system because the quality of a reproduced signal varies corresponding to the characteristics of a record medium (such as machining accuracy), the fluctuation of the power of recording laser light, and the recording/reproducing conditions (such as ambient temperature).

The calibration includes an adjustment of the power of reading laser light of the optical pickup 7, adjustments of the gains of the amplifiers 8 and 9, an adjustment of the waveform equalizing characteristics of the filter portion 11, and adjustments of amplitude reference values of the Viterbi decoder 13. The calibration is performed by a structure not shown in FIG. 1 just after the power of the apparatus is turned on or when a record medium is replaced with another one.

[Outline of Sector Format of Record Medium]

Figure 3A:
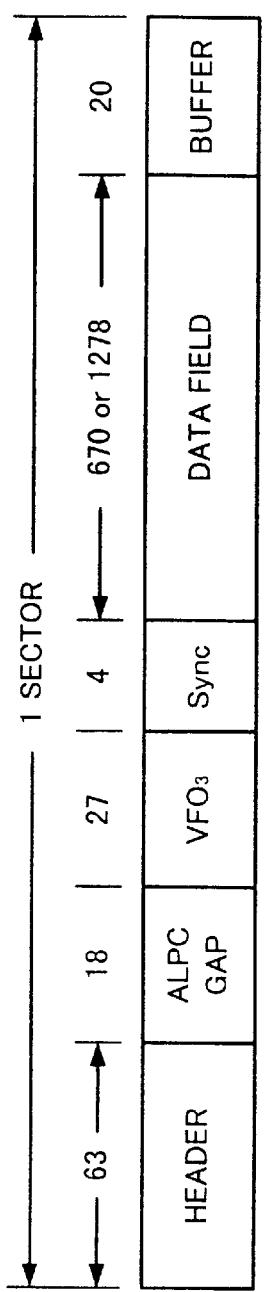
FIGS. 3A, 3B, and 3C are schematic diagrams for explaining an example of a sector format of a magneto-optic disc.

User data as sectors that are recording/reproducing data units are recorded on the magneto-optic disc 6. Next, with reference to FIG. 3, an example of the sector format of the magneto-optic disc 6 will be described. As shown in FIG. 3A, one sector has areas of a header, an ALPC, a gap, a $VFO_3$, a sync, a data field, and a buffer. In FIG. 3, numerals in individual areas represent bytes of data. Data that has been encoded by block encoding method is recorded on the magneto-optic disc 6. For example, data of eight bits is converted into data of 12 channel bits and recorded.

For example, there are two types of sector formats that are 1024-byte format and 512-byte format as the amount of user data. In the 1024-byte format, the number of bytes in the data field is 670 bytes. In the 512-byte format, the number of bytes in the data filed is 1278 bytes. The pre-formatted header (63 bytes) and the ALPC and gap area (18 bytes) in the 1024-byte format are the same as those in the 512-byte format.

Figure 3B:
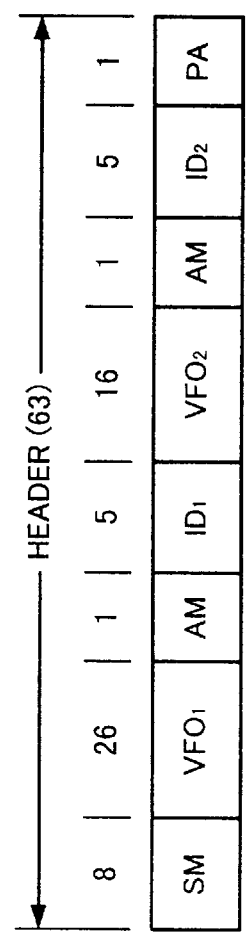

FIG. 3B shows the header composed of 63 bytes. The header has a sector mark SM (8 bytes), a $VFO_1$ (26 bytes) of a VFO field, an address mark AM (1 byte), an ID, (5 bytes) of an ID field, a $VFO_2$ (16 bytes) of the VFO field, an address mark AM (1 byte), an $ID_2$ (5 bytes) of the ID field, and a post-amble PA (1 byte).

Figure 3C:
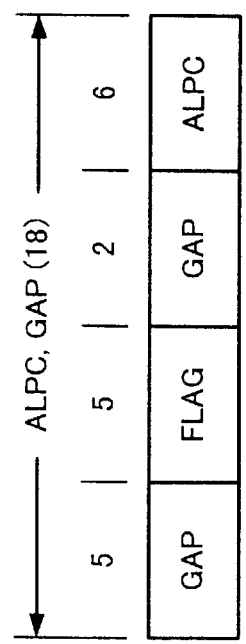

FIG. 3C shows the ALPC and gap area composed of 18 bytes. The ALPC and gap area has a gap field (5 bytes), a flag field (5 bytes), a gap field (2 bytes), and an ALPC (6 bytes).

Next, these fields will be described. The sector mark SM identifies the beginning of a sector. The sector mark SM has an embossed pattern that does not take place in the RLL(1, 7) code. The VFO field synchronizes with a VFO (Variable Frequency Oscillator) of the PLL portion 18. The VFO field is composed of the $VFO_1$, the $VFO_2$, and the $VFO_3$. VFO, and $VFO_3$ are embossed. The $VFO_3$ are magneto-optically written when the recording operation is performed for a relevant sector. The $VFO_1$, the $VFO_2$, and the $VFO_3$ have patterns of which channel bits "0" and "1" alternately take. place. These patterns are referred to as 2T patterns. Thus, assuming that the time period of one channel bit is denoted by T, when the VFO field is reproduced, a signal of which the level is inverted at intervals of 2T is obtained.

The address mark AM is used to synchronize with the next ID field for each byte. The address mark AM has an embossed pattern that does not take place in the RLL(1, 7) code. The ID field has the address of a relevant sector (namely, information of a track number and a sector number) and a CRC byte for detecting an error thereof. The ID field is composed of five bytes. With the $ID_1$ and $ID_2$, the same address information is redundantly recorded. The post amble PA has a pattern of which channel bits "0" and "1" alternately take place (namely, a 2T pattern). The $ID_1$, $ID_2$, and the post amble PA are embossed. Thus, the header area is a pre-formed area of which pits have been embossed.

FIG. 3C shows the gap area. In the gap area, pits are not formed. The first gap field (5 bytes) is a field just preceded by the pre-formatted header. The first gap field is used to assure the time period that the apparatus requires to process the header. The second gap field (2 bytes) is used to absorb the deviation of the position of the $VFO_3$.

In the ALPC and gap area, a flag field of five bytes is recorded. When data of a relevant sector is recorded, 2T patterns are successively recorded in the flag field. The ALPC (Auto Laser Power Control) field is disposed to test the laser power in the recording mode. A sync field (4 bytes) is used to cause the apparatus to synchronize with the next data field for each byte.

The data field is used to record user data. The data field of 670 bytes has user data (512 bytes), an error detection/ correction parity (144 bytes), a sector write flag (12 bytes), and two bytes (FF). On the other hand, the data field of 1278 bytes has user data (1024 bytes), an error detection/ correction parity (242 bytes), and a sector write flag (12 bytes). The buffer field at the last of the sector is used as a tolerance for an electric/mechanical error.

In the above-described sector formats, the header is an area of which pits are embossed. The ALPC and the gap area are not used in the reproducing operation. The $VFO_3$, the sync field, and the data field are data areas that have been magneto-optically recorded.

[Outline of Four-value Four-status Viterbi Decoding Method]

Next, the Viterbi decoding method of the Viterbi decoder 13 will be described. As described above, user data is converted into code words as recorded data by various encoding methods. A proper encoding method is used corresponding to the characteristic of a record medium and a recording/reproducing method. In the magneto-optic disc apparatus, in a block encoding process, RLL (Run Length Limited) encoding method that limits the run length (namely, the number of "0" between "1" and "1") has been widely used. There are several RLL encoding methods. Generally, m/n block code of which the number of "0"s between "1" and "1" is at least d and at most k is referred to as RLL(d, k; m, n) code.

For example, with the ⅔ block code, the block encoding method of which the number of "0"s between "1" and "1" is at least one and at most seven is RLL(1, 7; 2, 3) code. Generally, the RLL(1, 7; 2, 3) code is sometimes referred as to RLL(1, 7) code. Thus, in the following description, RLL(1, 7) code represents RLL(1, 7; 2, 3) code.

To decode a signal reproduced from data that has been recorded by a combination of the RLL encoding method and the mark edge recording method, the Viterbi decoding method can be used.

The RLL encoding method satisfies the conditions required for the encoding method from two view points of the improvement of the record density and the stability of the reproducing operation. As described above, in the mark edge recording method, since "1" of a pre-code generated with recorded data corresponds to the inversion of the polarity represented by an edge of each pit, as the number of "0"s between "1" and "1" is large, the number of bits recorded in each pit can be increased. Thus, the record density can be increased.

On the other hand, the read clock pulses DCK that cause the operations of the structural portions of the reproducing system to match are generated by the PLL portion 14 corresponding to a reproduced signal.

Thus, as the number of "0"s between "1" and "1" is large, in the reproducing operation, the PLL portion unstably operates. Thus, the entire reproducing operation becomes unstable.

Considering such two conditions, the number of "0"s between "1" and "1" should be in a proper range. For the number of "0"s in recorded data, the RLL encoding method is effective.

As shown in FIG. 4, in the combination of the RLL(1, 7) encoding method and the mark edge recording method, at least one "0"s is present between "1" and "1" of a pre-code generated corresponding to record data. Thus, the minimum inversion width is 2. When the encoding method whose minimum inversion width is 2 is used, as a method for reproducing recorded data from a reproduced signal that have been affected by inter-code interference and noise, four-value four-status Viterbi decoding method (that will be described later) can be used.

As described above, the filter portion 11 performs the waveform equalizing process for a reproduced signal. In the waveform equalizing process performed on the preceding stage of the Viterbi decoding process, partial response process that actively uses inter-code interference is used.

The waveform equalizing characteristic is obtained in consideration of the linear record density of the recording/reproducing system and the MTF (Modulation Transfer Function) of the partial response characteristics expressed by (1+D)n. The waveform equalizing process using PR(1, 2, 1) code for data recorded in the combination of the RLL(1, 7) encoding method and the mark edge recording method is disposed on the preceding stage of the four-value four-status Viterbi decoding method.

On the other hand, in the mark edge recording method, before data is recorded on a magneto-optic disc medium or the like, a pre-code is generated corresponding to the recorded data encoded by the RLL encoding process or the like. Assuming that the record data sequence at each time point k is denoted by a[k] and a pre-code thereof is denoted by b[k], the pre-code is generated as follows.

$$b[k] = \mod 2\{a[k] + b[k-1]\} \qquad (1)$$

The pre-code b[k] is actually recorded on a magneto-optic disc medium or the like. Next, the waveform equalizing process with a waveform equalizing characteristic PR(1, 2, 1) performed by the waveform equalizer of the filter portion 11 will be described. However, in the following description, it is assumed that the amplitude of a signal is not standardized and that the waveform equalizing characteristic is denoted by PR(B, 2A, B). In addition, the value of a reproduced signal that does not consider noise is denoted by c[k]. A really reproduced signal that includes noise (namely, a signal reproduced from a record medium) is denoted by z[k].

With the waveform equalizing characteristic PR(B, 2A, B), the contribution of the amplitude at a time point k is 2A times as large as the value of the reproduced signal at the time point k. In addition, the contribution of the amplitude at the time point k−1 or k+1 is B times as large as the value of the reproduced signal at the time point k−1 or k+1.

Thus, with the maximum value of the value of the reproduced signal, pulses are detected at time points k−1, k, and k+1. In this case, the maximum value of the reproduced signal is expressed as follows.

$$B + 2A + B = 2A + 2B$$

The minimum value of the reproduced signal is 0. However, actually, as c[k], A+B of DC component is subtracted as follows.

$$c[k] = B \times b[k-2] + 2A \times b[k-1] + B \times b[k] - A - B \qquad (2)$$

Figure 5:
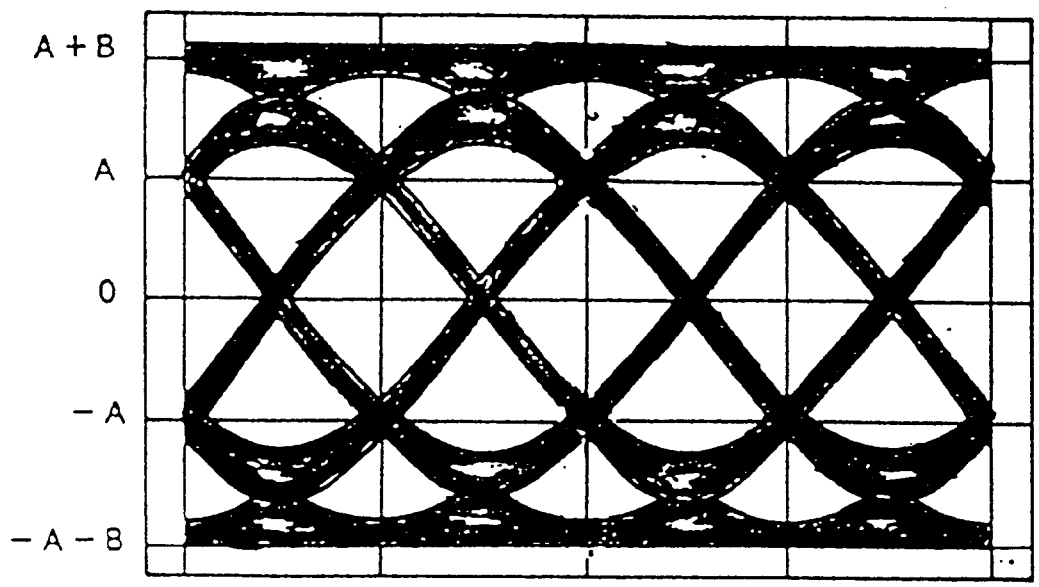
FIG. 5 is a schematic diagram for explaining an eye pattern in the case that a signal reproduced from data that has been recorded in a combination of RLL(1, 7) code encoding method and mark edge recording method is waveform-equalized with partial response characteristic PR(1, 2, 1).

Thus, the reproduced signal c[k] that does not consider noise is one of A+B, A, −A, or −A−B. Generally, as one of methods that represent the characteristic of a reproduced signal, reproduced signals at for example five time points are superimposed. The resultant signal is referred to as an eye pattern. FIG. 5 shows an example of an eye pattern of a reproduced signal z[k] of which the magneto-optic disc apparatus according to the present invention has performed the waveform equalizing process with the waveform equalizing characteristic PR(B, 2A, B). FIG. 5 shows that the value of the reproduced signal z[k] at each time point deviates due to noise. However, from FIG. 5 it is clear that the value is one of A+B, A, −A, and −A−B. As will be described later, A+B, A, −A, and −A−B can be used as identification points.

Figure 7:
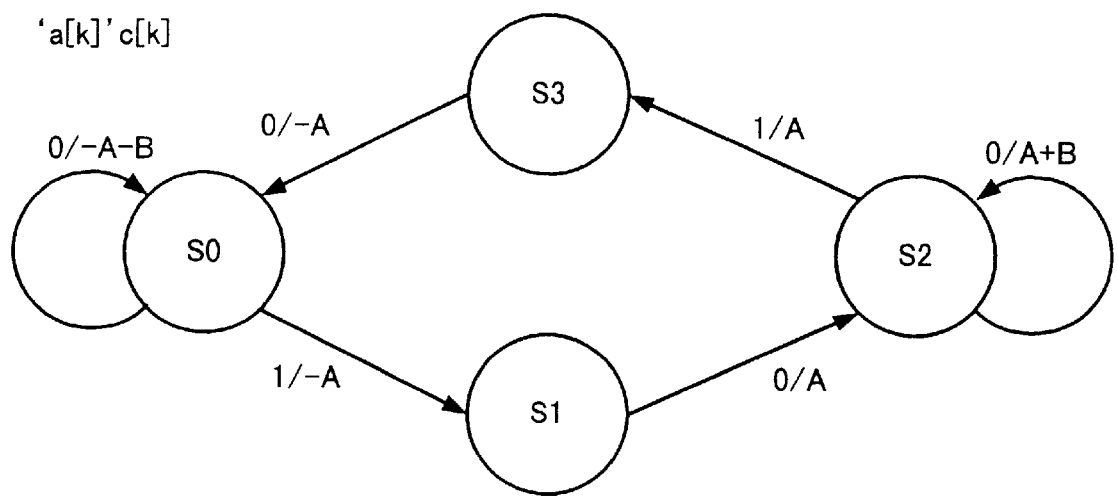
FIG. 7 is a schematic diagram showing an example of a status transition diagram of the four-value four-status Viterbi decoding method.

Next, the Viterbi decoding method for decoding a reproduced signal of which the above-described waveform equalizing process has been performed will be described. At step (1), all possible statuses corresponding to the encoding method and the record medium are obtained. At step (2), starting from each status at a particular time point, all possible status transitions at the next time point, record data a[k] of each status transition, and the value c[k] of the reproduced signal are obtained. A diagram that represents all the statuses and status transitions obtained at steps (1) and (2) and [value a[k] of record data/value c[k] of reproduced signal] in each status transition is referred to as status transition diagram. FIG. 7 shows a status transition diagram in the four-value four-status Viterbi decoding method. The Viterbi decoder 13 is structured so that it performs the decoding operation corresponding to the status transition diagram.

At step (3), based on the status transition diagram, the maximum likelihood status transition corresponding to the signal z[k] reproduced at each time point k from the record medium is selected. However, as described above, the signal z[k] has been waveform-equalized on the preceding stage of the Viterbi decoder 13. Whenever the maximum likelihood status transition is selected, the value of the recorded data a[k] in the status transition diagram is treated as a decoded value. Thus, decoded data a'[k] as the maximum likelihood decoded value sequence to the recorded data can be obtained. However, the maximum likelihood decoded value sequence is obtained from the decoded data value at each time point k is obtained by a PMU 23 of the Viterbi decoder 13. Thus, as described above, when there is no error in decoded data, the decoded data sequence a'[k] matches the recorded data sequence a[k]. Next, step (1) to (3) will be described in detail.

At step (1), a status at a time point k is defined with pre-codes at the time point k and earlier time points as follows. In other words, the status of which n=b[k], m=b[k−1], and 1=b[k−2] is defined as Snml. In this definition, it is considered that there are $2^3=8$ statuses. As described above, statuses that actually take place are restricted by the encoding method and so forth. In the recorded data sequence a[k] encoded with RLL(1, 7) code, since there is at least one "0" between "1" and "1", two or more "1"s do not succeed. A particular condition is applied to a pre-code b[k] corresponding to the conditions of the recorded data sequence a[k]. Thus, the resultant statuses are restricted.

Next, such a restriction will be practically described. As was described, a recorded data sequence that has been encoded with RLL(1, 7) does not include two or more "1"s that succeed. In other words, the following values do not take place.

$$a[k]=1, a[k-1]=1, a[k-2]=1 \qquad (3)$$

$$a[k]=1, a[k-1]=1, a[k-2]=0 \qquad (4)$$

$$a[k]=0, a[k-1]=1, a[k-2]=1 \qquad (5)$$

Corresponding to such a condition for the recorded data sequence, as a condition for b[k] corresponding to Formula (1), it is clear that two statuses S010 and S101 do not take place. Thus, the number of possible statuses is $2^{3-2}=6$.

Next, at step (2), starting from a status at a particular time point j, to obtain statuses at the next time point j+1, the cases of which the value a[j+1] of recorded data at the time point j+1 is 1 and 0 should be considered.

In this example, the status S000 is considered. Corresponding to Formula (1), there are two recorded data values pre-coded as the status S000 (namely, n=b[j]=0, 1=b[j−1]=0, m=b[j−2]=0) as follows.

$$a[j]=0, a[j-1]=0, a[j-2]=1 \qquad (6)$$

$$a[j]=0, a[j-1]=0, a[j-2]=0 \qquad (7)$$

[when a[j+1]=1]

At this point, corresponding to Formula (1), b[j+1] is calculated as follows.

$$b[j+1] = \mod 2 \{a[j+1] + b[j]\} \quad (8)$$
$$= \mod 2 \{1 + 0\}$$
$$= 1$$

Thus, the value of the reproduced signal c[j] is calculated corresponding to Formula (2) as follows.

$$c[j+1] = \{B \times b[j+1] + 2A \times b[j] + B \times b[j-1]\} \quad (9)$$
$$= -A - B$$
$$= \{B \times 1 + 2A \times 0 + B \times 0\} - A - B$$

In addition, in the status Snlm at the next time point j+1, the conditions of n=b[j+1], 1=b[j], and m=b[j−1] are satisfied. As described above, since b[j+1]=1, b[j]=0, and b[j−1]=0, the status at the next time point j+1 is S100. Thus, when a[j+1]=1, a transition S000–S100 takes place.

[when a[j+1] =0]

At this point, corresponding to Formula (1), b[j+1] is calculated as follows.

$$b[j+1] = \mod 2 \{a[j+1] + b[j]\} \quad (10)$$
$$= \mod 2 \{0 + 0\}$$
$$= 0$$

Thus, the value of the reproduced signal c[j+1] is calculated corresponding to Formula (2) as follows.

$$c[j+1] = \{B \times b[j+1] + 2A \times b[j] + B \times b[j-1]\} - A - B \quad (11)$$
$$= \{B \times 0 + 2A \times 0 + B \times 0\} - A - B$$
$$= -A - B$$

In the status Snlm at the next time point j+1, the conditions of n=b[j+1], 1=b[j], and m=b[j−1] are satisfied. As described above, since conditions of b[j+1]=0, b[j]=0, and b[j−1]=0 are satisfied, the status at the next time point is S000. Thus, when a[j+1]=0, a transition S000 S000 takes place.

Thus, in each status other than S000 at the time point j, the relation between status transitions starting from the status S000 at the next time point j+1 and recorded data values a[j+1] and reproduced signal values c[j+1) in each of the status transitions can be obtained.

Figure 6:
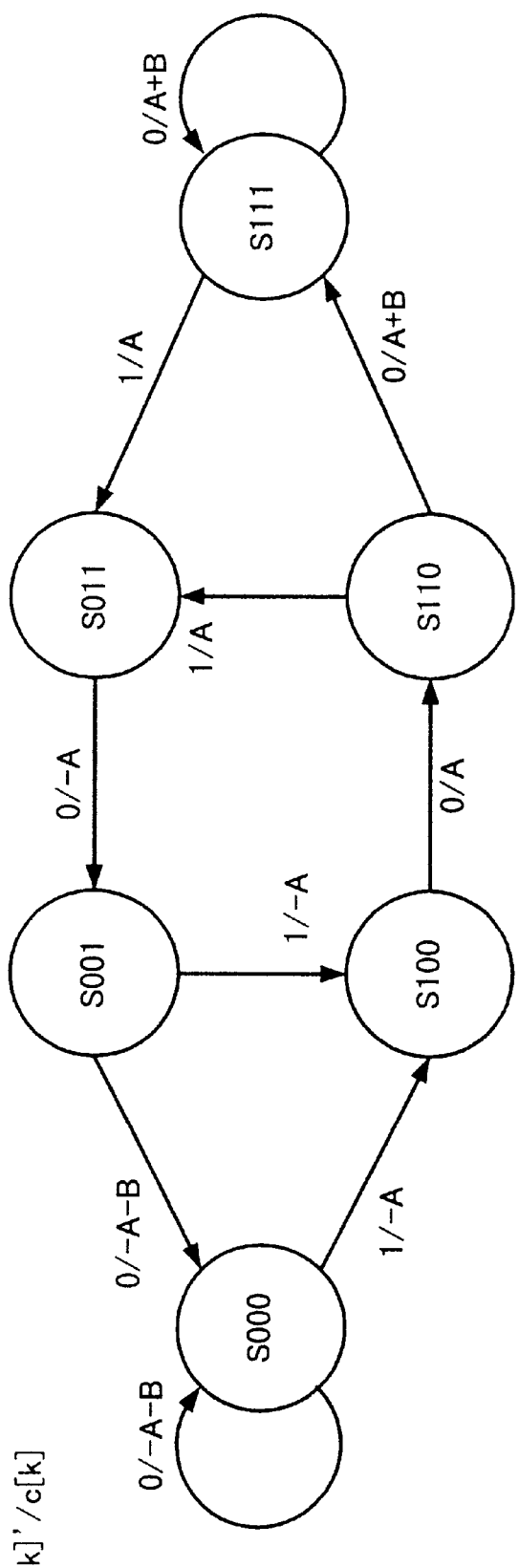
FIG. 6 is a schematic diagram for explaining a process for creating a status transition diagram of the four-value four-status Viterbi decoding method.

The relation between status transitions starting from each status and recorded data values and reproduced signal values in each of the status transitions is represented by a diagram shown in FIG. 6. The time points j and j+1 are not special time points. Thus, the relation between status transitions and recorded data values and reproduced signal values can be applied at any time point. Thus, in FIG. 6, a recorded data value and a reproduced signal value in a status transition at any time point k are denoted by a[k] and c[k], respectively.

In FIG. 6, a status transition is represented by an arrow. A code in association with each arrow represents [recorded data value a[k]/reproduced signal value c[k]]. There are two status transitions starting from each of the statuses S000, S001, S111, and S110. On the other hand, there is one status transition starting from each of the statuses S011 and S100.

In FIG. 6, in the statuses S000 and S001, when the recorded data value a[k] is 1, the reproduced signal value c[k] is −A. In this case, each of the statuses S000 and S001 changes to S100. When the recorded data value a[k] is 0, the reproduced signal value c[k] is −A−B. In this case, each of the statuses S000 and S001 changes to S000. In the statuses S111 and S110, when the recorded data value is a[k+1], the reproduced signal value is c[k+1]. In this case, each of the statuses S111 and S110 changes to the same status. Thus, the statuses S000 and S001 are denoted by S0. The statuses S111 and S110 are denoted by S2. In FIG. 7, the statuses S011 and S100 are denoted by S3 and S1, respectively.

As described above, FIG. 7 is a status transition diagram of four-value four-status Viterbi decoding method. FIG. 7 shows four statuses S0 to S4 and four reproduced signal values c[k+1]=−A−B, −A, A, and A+B. There are two status transitions starting from each of the statuses S0 and S2. There is only one status transition starting from each of the statuses S1 and S3.

Figure 8:
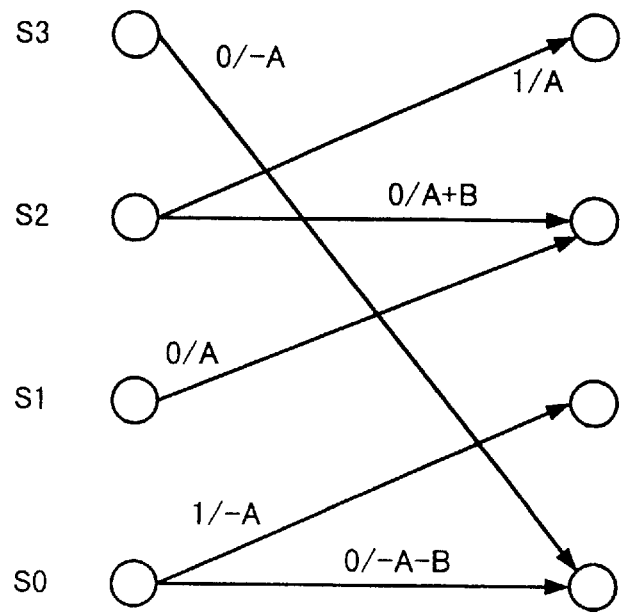
FIG. 8 is a schematic diagram showing an example of a Trellis diagram in the four-value four-status Viterbi decoding method.

As a format for chronologically representing status transitions, a trellis diagram as shown in FIG. 8 is used. In FIG. 8, status transitions between two time points are shown. However, it should be noted that transitions among many time points can be represented. In a trellis diagram, as time elapses, statuses changes rightwardly. Thus, a horizontal arrow represents a status transition of the same status (for example, from S0 to S0). On the other hand, a diagonal arrow represents a status transition of different statuses (for example, from S1 to S2).

Next, step (3) of the Viterbi decoding method (namely, based on the status transition diagram shown in FIG. 7, a method for selecting the maximum likelihood status transition from a really reproduced signal z[k] that includes noise) will be described.

To select the maximum likelihood status transition, with respect to a status at a particular time point k, the sums of likelihood of status transitions at a plurality of time points through other statuses are calculated. The sums are compared and the maximum likelihood decoded data sequence is selected. A sum of likelihood of status transitions is referred to as path metric.

To calculate a pass metric, it is necessary to calculate the likelihood of a status transition between two adjacent time points. This calculation is performed with the value of the reproduced signal z[k] corresponding to the above-described status transition diagram in the following manner. Now, consider a status Sa at a time point k−1. When a reproduced signal z[k] is input to the Viterbi decoder 31, the likelihood of a status transition to the status Sb is calculated as follows. In this case, statuses Sa and Sb are selected from four statuses in the status transition diagram shown in FIG. 7.

$$(z[k] - c(Sa, Sb))^2 \quad (12)$$

In Formula (12), c(Sa, Sb) is the value of a reproduced signal in a status transition from the status Sa to the status Sb in the status transition diagram shown in FIG. 7. In other words, in FIG. 7, in the status transition S0→S1, c(Sa, Sb) is −A. Thus, Formula (12) represents an Euclidean distance between the value of the really reproduced signal z[k] that includes noise and the value of the reproduced signal c(Sa, Sb) calculated without considering noise. A path metric at a particular time point is defined as the sum of likelihood of status transitions between adjacent time points.

Now, consider a status Sa at a time point k. In this case, when the status that changes to a status Sa at a time point k−1 is Sp, a path metric L(Sa, k) is calculated with a path metric at a time point k−1 as follows.

$$L(Sa, k) = L(Sp, k-1) + (z[k] - c(Sp, Sa))^2 \qquad (13)$$

In other words, by adding a path metric L(Sp, k−1) in the status Sp at the time point k−1 and the likelihood (z[k]−c(Sp, Sa))² of the status transition Sp→Sa between the time point k−1 and the time point k, a path metric L(Sa, k) is calculated. The likelihood of the latest status transition as in (z[k]−c(Sp, Sa) )² is referred to as branch metric. It should be noted that the branch metric is different from a branch metric calculated by a branch metric calculating circuit (BMC) 20 of the Viterbi decoder 13 (namely, a branch metric corresponding to a standardized metric).

When the status at a time point k is Sa, there may be a plurality of statuses that change to the status Sa at a time point k−1 (as in the status S0 and S2 shown in FIG. 7). When the status at the time point k is S0, the statuses that change to the status S0 at the time point k−1 are two statuses S0 and S3.

When the status at the time point k is S2, there are two statuses S1 and S2 that change to the status S2 at the time point k−1. For general description, when the status at the time point k is Sa and the statuses that change to the status Sa at the time point k−1 are two statuses Sp and Sq, the path metric L(Sa, k) is calculated as follows.

$$L(Sa, k) = \min \{L(Sp, k-1) + (z[k] - c(Sp, Sa))^2, \qquad (14)$$
$$L(Sq, k-1) + (z[k] - c(Sq, Sa))^2\}$$

In other words, with respect to each of the case that the status at the time point k−1 is Sp and the status Sp changes to the status Sa by a status transition Sp→Sa and the case that the status at the time point k−1 is Sq and the status Sq changes to the status Sa by a status transition Sq→Sa, the sum of likelihood is calculated. The sums are compared. The smaller value of the sums is defined as a path metric L(Sa, k) for the status Sa at the time point k.

When the calculation for such a path metric is applied to the above-described four values and four statuses shown in FIG. 7, path metrics L(0, k), L(1, k), L(2, k), and L(3, k) of the statuses S0, S1, S2, and S3 at the time point k can be calculated with path metrics L(0, k−1), L(1, k−1), L(2, k−1), and L(3, k−1) in the statuses S0, S1, S2, and S3 at the time point k−1, respectively, as follows.

$$L(0, k) = \min \{L(0, k-1) + (z[k] + A + B)^2, L(3, k-1) + (z[k] + A)^2\} \qquad (15)$$

$$L(1, k) = L(0, k-1) + (z[k] + A)^2 \qquad (16)$$

$$L(2, k) = \min \{L(2, k-1) + (z[k] - A - B)^2 L(1, k-1) + (z[k] - A)^2\} \qquad (17)$$

$$L(3, k) = L(2, k-1) + (z[k] - A)^2 \qquad (18)$$

As described above, by comparing the values of the calculated path metrics, the maximum likelihood status transition is selected. To select the maximum likelihood status transition, it is not necessary to calculate the values of the path metrics. Instead, the values of the path metrics are compared. Thus, in the real four-value four-status Viterbi decoding method, when standardized path metrics that are defined as follows are used instead of path metrics, calculations with respect to z[k] at each time point k can be easily performed.

$$m(i, k) = [L(i, k) - z[k]^2 - (A + B)^2]/2/(A + B) \qquad (19)$$

When Formula (19) is applied to each of the statuses S0 to S3, standardized path metrics do not include square terms. Thus, the calculations of an adding, comparing, and selecting circuit (ACS) 21 can be simplified.

$$m(0, k) = \min \{m(0, k-1) + z[k], m(3, k-1) + \alpha \times z[k] - \beta\} \qquad (20)$$

$$m(1, k) = m(0, k-1) + \alpha \times z[k] - \beta \qquad (21)$$

$$m(2, k) = \min \{m(2, k-1) - z[k], m(1, k-1) - \alpha \times z[k] - \beta\} \qquad (22)$$

$$m(3, k) = m(2, k-1) + \alpha \times z[k] - \beta \qquad (23)$$

where α and β of Formulas (20) to (23) are defined as follows.

$$\alpha = A/(A+B) \qquad (24)$$

$$\beta = B \times (B + 2 \times A)/2/(A+B) \qquad (25)$$

FIG. 9 shows conditions of status transitions of the four-value four-status Viterbi decoding method corresponding to such standardized path metrics. There are two formulas for selecting one from two in the above-described four standardized path metrics. Thus, there are (2×2=4) conditions.

[Outline of Four-value Four-status Viterbi Decoder]

Next, the Viterbi decoder 13 that accomplishes the above-described four-value four-status Viterbi decoding method will be described. The Viterbi decoder 13 comprises a branch metric calculating circuit (BMC) 20, an adding, comparing, and selecting circuit (ACS) 21, a compression and latch circuit 22, and a path memory unit (PMU) 23. The above-described read clock pulses DCK (simply referred to as clock pulses) are supplied to individual structural portions of the decoder 13 so as to match the operation timings of the structural portions of the entire Viterbi decoder 13. Next, the structural portions of the Viterbi decoder 13 will be described one after the other.

The BMC20 calculates values BM0, BM1, BM2, and BM3 of branch metrics corresponding to standardized path metrics based on an input reproduced signal z[k]. The values BM0 to BM3 are required to calculate the standardized path metrics in Formulas (20) to (23). The values BM0 to BM3 are expressed as follows.

$$BM0 = z(k) \qquad (26)$$

$$BM1 = \alpha \times z[k] - \beta \qquad (27)$$

$$BM2 = -z(k) \qquad (28)$$

$$BM3 = -\alpha \times z[k] - \beta \qquad (29)$$

where α and β are reference values calculated corresponding to Formulas (24) and (25) by the BMC 20.
In these calculations, an envelop is detected corresponding to for example a reproduced signal [k]. a and f are calculated corresponding to identification points −A −B, −A, A, and A+B that is detected by an envelop detecting method corresponding to the reproduced signal z[k] and that is supplied to the BMC 20.

The values BM0 to BM3 are supplied to the ACS 21. On the other hand, the ACS 21 receives values M0, M1, M2, and M3 (that have been compressed) of standardized path metrics one clock pulse prior from the compression and latch circuit 22. By adding the values M0 to M3 and BM0 to BM3, the values L0, L1, L2, and L3 of the latest standardized path metrics are calculated. Since the values M0 to M3 have been compressed, L0 to L3 can be prevented from overflowing.

The ACS 21 selects the maximum likelihood status transition (that will be described later) corresponding to the values L0 to L3 of the latest standardized path metrics. Corresponding to the selected result, the signal levels of the selection signals SEL0 and SEL2 supplied to the path memory 23 become "High" or "Low".

The ACS 21 supplies the values L0 to L3 to the compression and latch circuit 22. The compression and latch circuit 22 compresses the values L0 to L3 and then latches them. Thereafter, the ACS 21 supplies the compressed values L0 to L3 as standardized path metrics M0 to M3 one clock pulse prior to the ACS 21.

As an example of the compressing method, one (for example, L0) of the latest standardized path metrics L0 to L3 is subtracted therefrom in the following manner.

$$M0 = L0 - L0 \tag{30}$$

$$M1 = L1 - L0 \tag{31}$$

$$M2 = L2 - L0 \tag{32}$$

$$M3 = L3 - L0 \tag{33}$$

As a result, M0 is always 0. However, in the following description, to keep the generality, M0 is represented as it is. The differences of the values M0 to M3 calculated by Formulas (30) to (33) are equal to the differences of the values L0 to L3. As described above, in the selection of the maximum likelihood status transition, only the differences of the values of the standardized path metrics are important. Thus, such a compressing method is effective for a method for compressing the values of the standardized path metrics without affecting the selected result of the maximum likelihood status transition and for preventing L0 to L3 from overflowing. In such a manner, the ACS 21 and the compression and latch circuit 22 compose a loop with respect to calculations of standardized path metrics.

Figure 11:
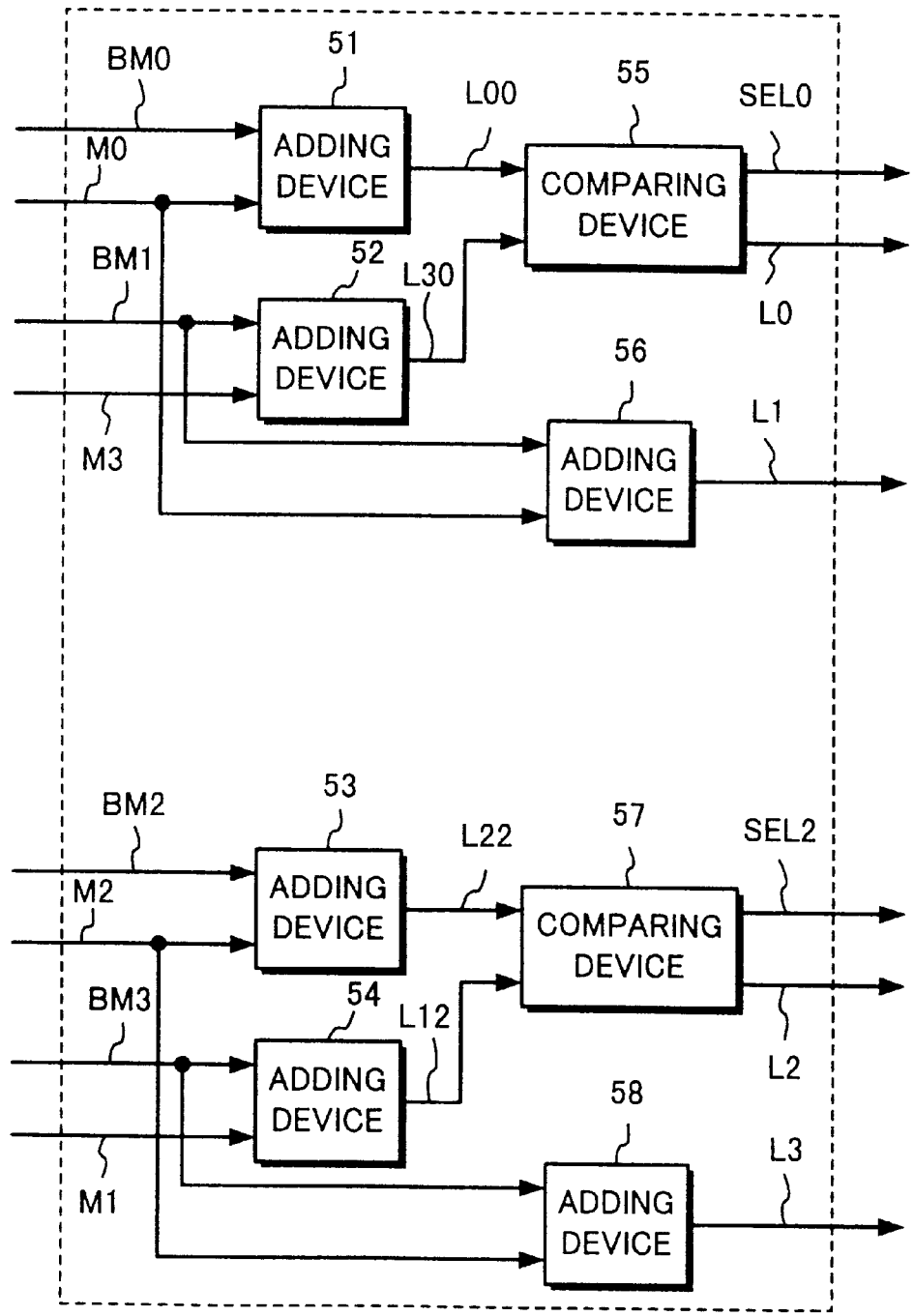
FIG. 11 is a block diagram showing the structure of a part of the Viterbi decoder shown in FIG. 10.

Next, with reference to FIG. 11, the ACS 21 will be described in detail. The ACS 21 is composed of six adding devices 51, 52, 53, 54, 56, and 58 and two comparing devices 55 and 57. On the other hand, values M0 to M3 of compressed standardized path metrics one clock pulse prior and values BM0 to BM3 of branch metrics corresponding thereto are supplied to the ACS 21.

The values M0 and BM0 are supplied to the adding device 51. The adding device 51 adds the values M0 and BM0 and outputs L00 that is expressed as follows.

$$L00 = M0 + BM0 \tag{34}$$

As described above, th value M0 is a compressed standardized path metric corresponding to the sum of status transitions in the status S0 at the time point k−1. The value BM0 is calculated with the reproduced signal z[k] at the time point k corresponding to Formula (26). The value BM0 is the value z[k]. Consequently, the value of Formula (34) is a calculated value of m(0, k−1)+z[k] (that has been compressed) in Formula (20). In other words, the value of Formula (34) is a calculated value in the case that the status S0 at the time point k−1 changes to the status S0 at the time point k by a status transition S0 S0.

On the other hand, the values M3 and BM1 are supplied to the adding device 52. The adding device 52 adds the values M3 and BM1 and outputs L30 that is expressed as follows.

$$L30 = M3 + BM1 \tag{35}$$

As described above, the value M3 is a compressed standardized path metric corresponding to the sum of status transitions in the case that the status at the time point k−1 is S3. The value BM1 is calculated with the reproduced signal z[k] at the time point k corresponding to Formula (27). Thus, The value BM1 is expressed by a×z[k]−β. Consequently, the value of Formula (35) is a calculated value of m(3, k−1)+a×z k]−z (that has been compressed) in Formula (20). In other words, the value of Formula (35) is a calculated value in the case that the status S3 at the time pint k−1 changes to the status S0 at the time point k by a status transition S3−S0.

The values L00 and L30 are supplied to the comparing device 55. The comparing device 55 compares the values L00 and L30 and treats the smaller value as the latest standardized path metric L0. In addition, corresponding to the selected result, as described above, the comparing device 55 changes the signal level of the selection signal SEL0. This structure corresponds to the selection of the minimum value in Formula (20). In other words, when L00<L30 (in this case, the status transition S0→S0 is selected), the comparing device 55 outputs the value L00 as the values L0 and causes the signal level of the selection signal SEL0 to be for example "Low". On the other hand, when L30<L00 (in this case, the status transition S3→S0 is selected), the comparing device 55 outputs the value L30 as the value L0 and causes the signal level of the selection signal SEL0 to be for example "High". As will be described later, the selection signal SEL0 is supplied to an A type path memory 24 (that will be descried later) corresponding to the status SO.

As described above, the adding devices 51 and 52 and the comparing device 55 select the maximum likelihood status transition at the time point k from the status transitions S0→S0 and S3→S0 corresponding to Formula (20). Corresponding to the selected result, the comparing device 55 outputs the latest standardized path metric L0 and the selection signal SEL0.

The values M0 and BM1 are supplied to the adding device 56. The adding device 51 adds the values M0 and BM1 and outputs Li expressed as follows.

$$L1 = M0 + BM1 \tag{36}$$

As described above, the value M0 is a compressed standardized path metric corresponding to the sum of the status transitions in the case that the status at the time point k−1 is S0. The value BM1 is calculated with the reproduced signal z[k] at the time point k corresponding to Formula (27). Namely, the value BM1 is expressed by α×z[k]−β. Thus, the value of Formula (36) is a calculated value of the right side m(0, k−1)+α×z[k]−β (that has been compressed) in Formula (21). In other words, the value of Formula (36) is a calculated value in the case that the status S0 at the time point k−1 changes to the status S1 at the time point k by a status transition S0 S1. In Formula (21), a value is not selected. Thus, the output data of the adding device 56 is the latest standardized path metric L1.

The values M2 and BM2 are supplied to the adding device 53. The adding device 53 adds the values M2 and BM2 and outputs L22 expressed as follows.

$$L22 = M2 + BM2 \tag{37}$$

As described above, the value M2 is a compressed standardized path metric corresponding to the sum of status transitions in the case that the status at the time point k−1 is S2. The value BM0 is calculated with the reproduced signal z[k] at the time point k corresponding to Formula (28). In other words, the value BM0 is -z[k]. Thus, the value of Formula (37) is a calculated value of m(2, k−1)−z[k] (that has been compressed) in Formula (22). In other words, the value of Formula (37) is a calculated value in the case that the status S2 at the time point k changes to the status S2 by a status transition S2→S2.

On the other hand, the values M1 and BM3 are supplied to the adding device 54. The adding device 53 adds the values M1 and BM3 and outputs L12 expressed as follows.

$$L12=M1+BM3 \quad (38)$$

As described above, the value M1 is a compressed standardized path metric corresponding to the sum of status transitions in the case that the status at the time point k−1 is S1. The value BM3 is calculated with the reproduced signal z[k] at the time point k corresponding to Formula (29). In other words, the value BM3 is expressed by −α×z[k]−1. Thus, the value of Formula (38) is a calculated value of m(1, k−1)−α×z[k]−β (that has been compressed) in Formula (22). In other words, the value of Formula (38) is a calculated value in the case that the status S1 at the time point k−1 changes to the status S2 at the time point k by a status transition S1→S2.

The values L22 and L12 are supplied to the comparing device 57. The comparing device 57 compares the values L2 and L12, treats the smaller value as the latest standardized path metric L2, and changes the signal level of the selection signal SEL2 corresponding to the selected result. This structure corresponds to the selection of the minimum value in Equation (22). In other words, when L22<L12 (in this case, the status transition S2→S2 is selected), the comparing device 57 outputs the value L22 as L2 and causes the signal level of the selection signal SEL2 to be for example "Low". On the other hand, when L12<L22 (in this case, the status transition S1→S2 is selected), the comparing device 57 outputs the value L12 as L2 and causes the signal level of the selection signal SEL2 to be for example "High". As will be descried later, the selection signal SEL2 is supplied to an A type path memory 26 that corresponds to the status S2.

The adding devices 53 and 54 and the comparing device 57 select the maximum likelihood status transition at the time period k from the status transitions S1→S2 and S2→S2corresponding to Formula (22). The comparing device 57 outputs the latest standardized path metric L2 and the selection signal SEL2 corresponding to the selected result.

The values M2 and BM3 are supplied to the adding device 58. The adding device 58 adds the values M2 and BM3 and outputs L3 expressed as follows.

$$L3=M2+BM3 \quad (39)$$

As described above, the value M2 is a compressed standardized path metric corresponding to the sum of status transitions in the case that the status at the time point k−1 is S2. The value BM3 is calculated with the reproduced signal z[k] at the time point k corresponding to Formula (29). In other words, the value BM3 is expressed by −α×z[k]−β. Thus, the value of Formula (23) is a calculated value of the right side m(2, k−1)+α×z[k]−β (that has been compressed) in Formula (23). In other words, the value of Formula (23) is a calculated value in the case that the status S0 at the time point k−1 changes to the status S3 at the time point k by a status transition S2→S3. In Formula (23), a value is not selected. Thus, the output data of the adding device 58 is the latest standardized path metric L3.

As described above, since the path memory unit (PMU) 23 operates corresponding to the selection signals SEL0 and SEL2 received from the ACS 21, decoded data a'[k] as the maximum likelihood decoded data sequence according to the recorded data a[k] is generated. The PMU 23 is composed of two A type bus memories and two B type bus memories that correspond to status transitions of four status shown in FIG. 7.

An A type path memory has two transitions to a particular status (namely, a transition from the particular status to the same status and a transition from another status to the particular transition). In addition, the A type path memory has a structure corresponding to two transitions starting from the particular status (namely, a transition from the particular status to the same status and a transition from the particular status to another status). Thus, the A type path memory corresponds to the two statuses S0 and S2 of the four statuses shown in FIG. 7.

On the other hand, a B type path memory has one transition to a particular status. In addition, the B type path memory has a structure corresponding to one transition starting from the particular status. Thus, the B type path memory corresponds to the status S1 or S3 of the four statuses shown in FIG. 7.

Figure 10:
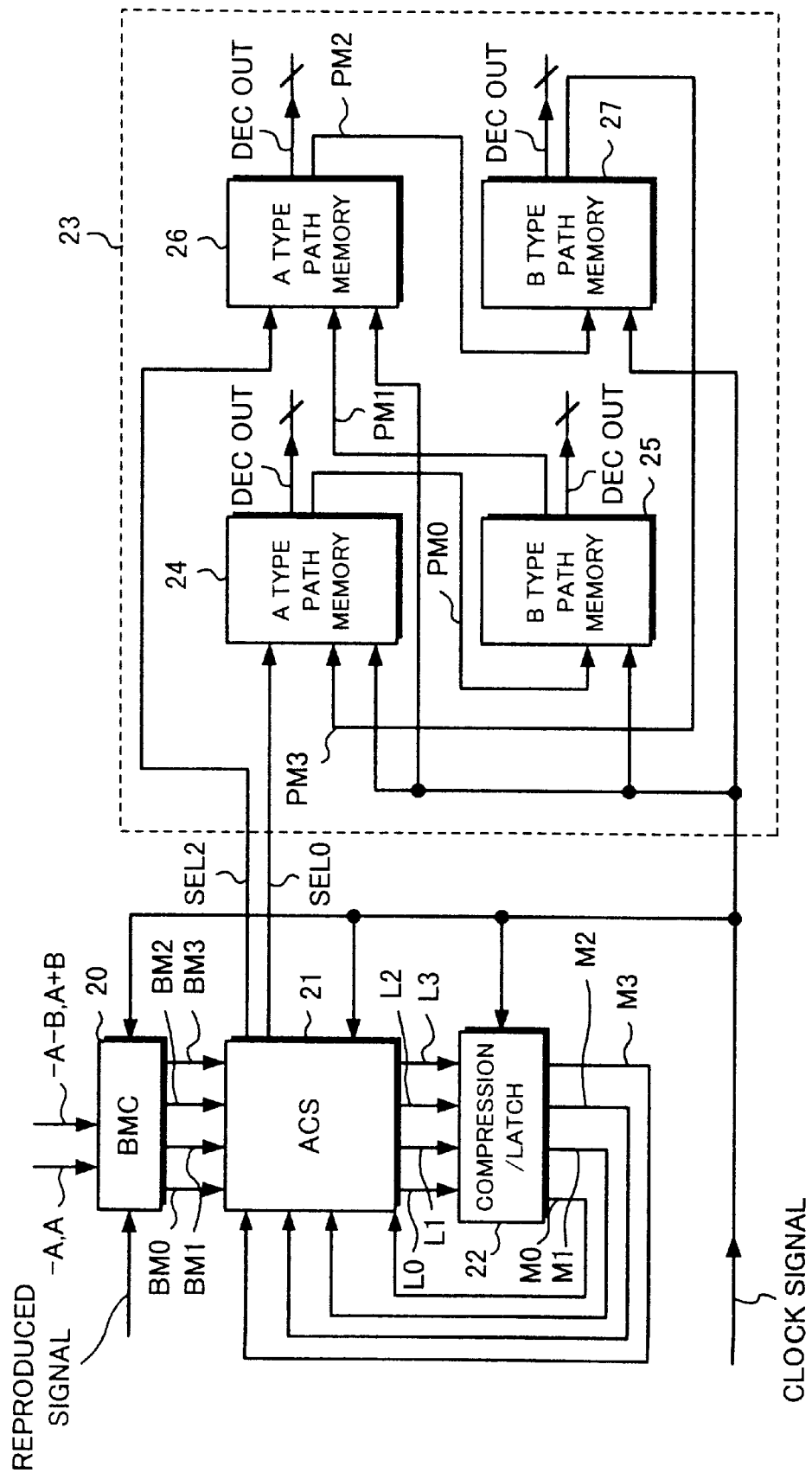
FIG. 10 is a block diagram showing the overall structure of a Viterbi decoder that performs the four-value four-status Viterbi decoding process.

The PMU 23 exchanges decoded data as shown in FIG. 10 so that the two A type path memories and the two B type path memories operate corresponding to the status transition diagram shown in FIG. 7. In other words, the A type path memories 24 and 26 correspond to the statuses S0 and S2, respectively. The B type path memories 25 and 27 correspond to the statuses S1 and S3, respectively. Thus, the status transitions starting from S0 are S0→S0 and S0→S1. The status transitions starting from S2 are S2→S2 and S2→S3. In addition, the status transition starting from S1 is only S1→S2. The status transition starting from S3 is S3→S0.

Figure 12:
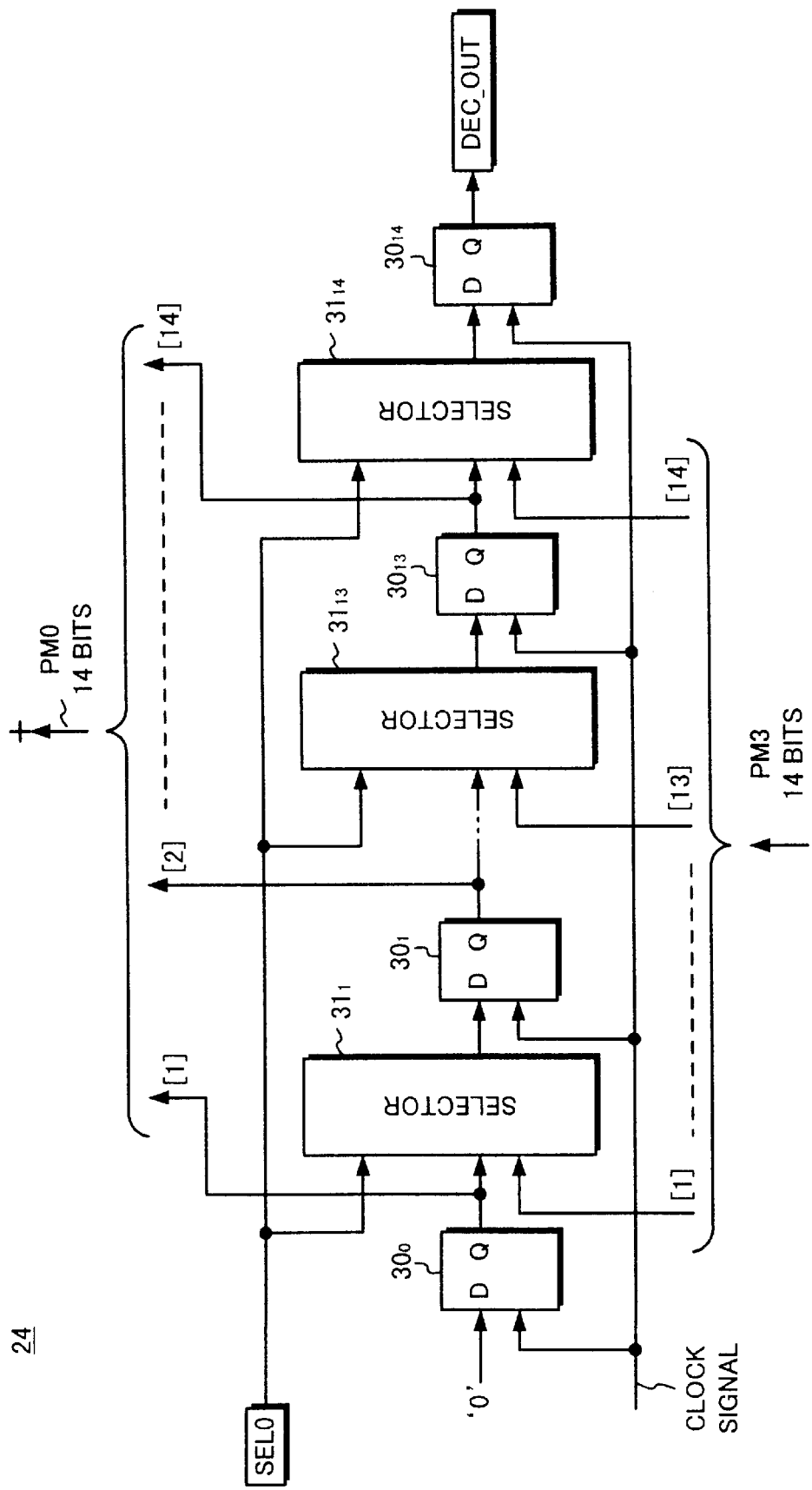
FIG. 12 is a block diagram showing the structure of another part of the Viterbi decoder shown in FIG. 10.

FIG. 12 shows the detailed structure of the A type path memory 24. The A type path memory 24 is composed of flip-flops and selectors that are alternately disposed corresponding to the length of the path memory. The structure shown in FIG. 12 has a decoded data length of 14 bits. In other words, the A bus memory 24 has 14 selectors 311 to 3114 and 15 flip-flops $30_0$ to $30_{14}$. The selectors $31_1$ to $31_{14}$ each receive two data values and selectively supplies one of them to the next stage. In addition, clock pulses are supplied to the flip-flops $30_0$ to $30_{14}$ so as to match the operation timings of the structural portions of the A type path memory 24.

As was described in FIG. 7, transitions to the status S0 are S0→S0 (where the self status is taken over) and S3→S0. In the structure that corresponds to such a situation, each selector receives data from the flip-flop on the preceding stage (namely, decoded data corresponding to the status transition S0→S0) and data received from the B type path memory 27 that corresponds to the status S3 (namely, decoded data PM3 corresponding to the status transition S3→S0). In addition, each selector receives the selection signal SEL0 from the ACS 21. Each selector supplies one of two decoded data values to the flip-flop on the next stage corresponding to the signal level of the selection signal SEL0. The decoded data value that is supplied to the flip-flop on the next stage is also supplied as PM0 to the B type path memory 25 that corresponds to the status S1.

In other words, the selector 3114 receives a data value from the flip-flop 3013 on the preceding stage and the 14-th bit of the decoded data value PM3 from the B type path memory 27. The selected data value is supplied to the flip-flop $30_{14}$ on the next stage. As described above, corresponding to the selected result, the signal level of the selection signal SEL0 is set to "Low" or "High". When the signal level of the selection signal SEL0 is for example "Low", a data value received from the flip-flop $30_{13}$ on the preceding stage is selected. When the signal level of the selection signal SEL0 is for example "High", the 14-th bit of the decoded data value PM3 is selected. The selected data value is supplied to the flip-flop $30_{14}$ on the next stage. The 14-th bit of the decoded data value PM0 is supplied to the B type path memory 25 that corresponds to the status S1.

The other selectors $31_1$ to $31_{13}$ of the A type path memory 24 operate as with the selector $31_{14}$ corresponding to the signal level of the signal level SEL0. Thus, when the selection signal SEL0 is for example "Low", the A type path memory 24 perform a serial shifting operation of which each flip-flop takes over data of the flip-flop on the preceding stage. On the other hand, when the signal level of the selection signal SEL0 is "High", the A type path memory performs a parallel loading operation of which each flip-flop takes over the decoded data value PM3 of 14 bits received from the B type path memory 27. In any case, the decoded data value that is taken over is supplied as the decoded data value PM0 of 14 bits to the B type path memory 25.

"0" is always supplied to the flip-flop $30_0$ on the first stage in synchronization with the clock signal. In each of the status transitions S0→S0 and S2→S0, as shown in FIG. 7, since the decoded data value is "0", the latest decoded data value is always As described above, the structure of the A type path memory 26 that corresponds to S2 is the same as the structure of the A type path memory 24. However, the A type path memory 26 receives the selection signal from the ACS 21. In addition, as shown in FIG. 7, there are two transitions S2→S2 (where the self status is taken over) and S1→S2. Thus, the B type path memory 25 that corresponds to the status S1 supplies the decoded value PM1 to the A type path memory 26. In addition, since the status transitions starting from S2 are S2 and S3, the A type path memory 26 supplies the decoded data value PM2 to the B type pass memory 27 that corresponds to the status S3.

"0" is always supplied to the flip-flop on the first stage of the A type path memory 26 that corresponds to the status S2 in synchronization with the clock signal. This operation in each of the status transitions S2→S2 and S1→S2 corresponds to the situation that since the decoded data value is "0", the latest decoded data value is always "0".

Figure 13:
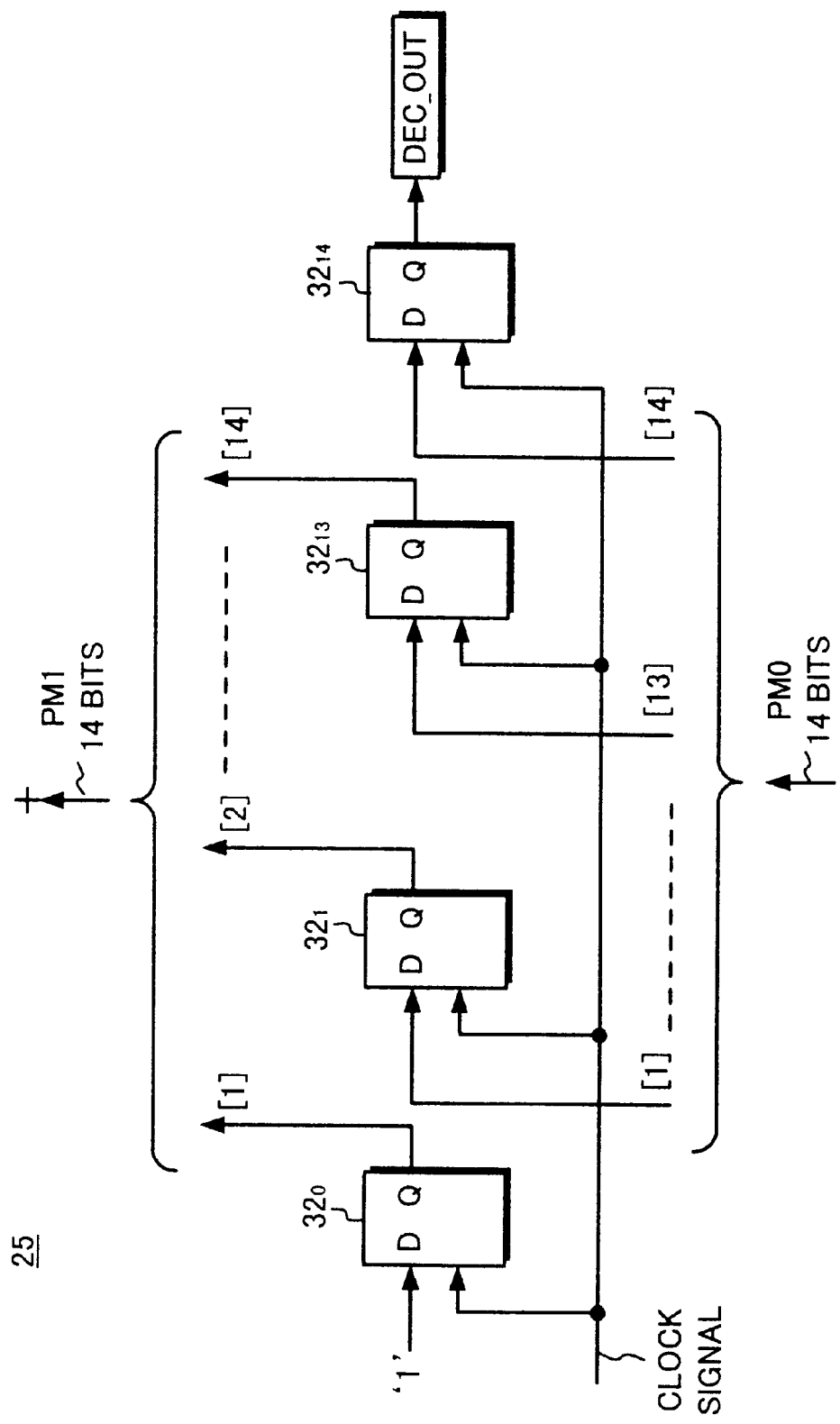
FIG. 13 is a block diagram showing the structure of a further other part of the Viterbi decoder shown in FIG. 10.

FIG. 13 shows the detailed structure of the B type path memory 25. The B type path memory 25 is composed of flip-flops corresponding to the length of the path memory. FIG. 13 shows a structure corresponding to a decoded data length of 14 bits. In other words, the B type path memory 25 has 15 flip-flops $32_0$ to $32_{14}$. Clock pulses are supplied to the flip-flops $32_0$ to $32_{14}$ so as to match the operation timings of the structural portions of the B type path memory 25.

The A type path memory 24 that correspond to the status S0 supplies a decoded data value of 14 bits as PM0 to the flip-flops $32_1$ to $32_{14}$. For example, the first bit of the decoded data value PM0 is supplied to the flip-flop $32_1$. Each of the flip-flops $31_1$ to $32_{14}$ stores the received value for the period of one clock pulse and supplies the stored value as a decoded data value PM1 of 14 bits to the A type path memory 26 that corresponds to the status S2. For example, the flip-flop 32, outputs the second bit of the decoded data value PM1.

The other flip-flops $32_0$ to $32_{13}$ of the B type path memory 25 operate as with the flip-flop $32_1$. Thus, the B type path memory 25 receives the decoded data value PM0 of 14 bits from the A type path memory 24 and supplies the decoded data value PM1 of 14 bits to the A type path memory 26.

"1" is always supplied to the flip-flop $32_0$ in synchronization with the clock signal. This operation corresponds to the situation that when the latest status transition is S0→Si, the decoded data value is "1".

As described above, the structure of the B type path memory 27 that corresponds to the status S3 is the same as the structure of the B type path memory 25. However, as shown in FIG. 7, since the status transition to the status S3 is S2→S3, the decoded data value PM2 is supplied from the A type path memory 26 that corresponds to the status S2 to the B type path memory 27. In addition, since the status starting from the status S3 is S0, the decoded data value PM3 is supplied to the A type path memory 24 that corresponds to the status S0. In the B type path memory 27, "1" is always supplied to the flip-flop on the last stage in synchronization with the clock signal. This operation corresponds to the situation that when the latest status transition is S2→S3, the decoded data is "1" as shown in FIG. 7.

As described above, the four path memories of the PMU 23 respectively generate decoded data values. The four decoded data values are always the same when the Viterbi decoding process is accurately performed. In the real Viterbi decoding process, mismatches takes place in the four decoded data values. This situation takes place due to noise in a reproduced signal. Thus, when the identification points A and B are detected, an error takes place and thereby the Viterbi decoding process becomes inaccurate.

Generally, the probability of which the four decoded data values do not match can be lowered when the number of stages of path memories is increased. In other words, when the quality such as C/N of the reproduced signal is high, even if the number of stages of path memories is relatively small, the probability of which the four decoded data values do not match is low. On the other hand, when the quality of a reproduced signal is not high, to lower the probability of which the four decoded data values do not match, it is necessary to increase the number of stages of path memories. When the number of stages of path memories is relatively small and thereby the probability of which the four decoded data values do not match cannot be sufficiently lowered, a structure (not shown) for selecting a proper decoded data value corresponding to the rule of majority is disposed downstream of the four path memories of the PMU 23.

[Viterbi Decoding Method Other than Four-value Four-status Viterbi Decoding Method]

The above-described four-value four-status Viterbi decoding method is applied to the case that the waveform equalizing characteristic of the filter portion 11 is PR(1, 2, 1) and that RLL(1, 7) code is used for recorded data. In the conditions that the record linear density is 0.40 μm, that the laser wavelength is 685 nm, and that NA is 0.55, with a waveform equalizing characteristic PR(1, 2, 1), the four-value four-status Viterbi decoding method can be optimally used. However, another Viterbi decoding method may be used corresponding to the waveform equalizing characteristic or an encoding method for generating recorded data.

For example, in the case that the waveform equalizing characteristic is PR(1, 1) and that an RLL(1, 7) code is used for recorded data, three-value four-status Viterbi decoding method is used. On the other hand, in the case that the waveform equalizing characteristic is PR(1, 3, 3, 1) and that an RLL(1, 7) code is used for recorded data, seven-value six-status Viterbi decoding method is used. A proper Viterbi decoding methods is selected from such methods corresponding to a waveform equalizing characteristic that is properly adapted to an inter-code interference of a reproduced signal. Thus, an optimum Viterbi decoding method is selected corresponding to a record linear density and MTF.

In an example of a magneto-optic disc apparatus described above, the PLL block 14 causes a PLL to be locked in analog process with 2T signal that is reproduced from 2T pattern recorded on VFO field in the sector format. Different from the example, in the present invention, three kinds of phase error signal is generated with phase errors detected in operation of three modes, namely a Viterbidetermination mode, a frequency lock mode, and an MSB determination mode respectvely. And, in the present invention, a structure is prepared in which a PLL can be caused to be locked with each of these three kinds of phase errors. Further, in the present invention, the mode to be used as an aquisition mode and a tracking mode is to be switced. Then, the structure can be made up the demerits of these three modes, and consequently a PLL can be caused to be locked more stably.

Next, these three modes will be described one after the other. First, in Viterbi determination mode, phase error is to be detected in the timing madewith status data. The Status data is series of status data values, and the status data value represent status transitions selected by ACS in Viterbi decoding process. Thus, it is necessary that a Viterbi decoder that produces a status data is included in the apparatus to operate Viterbi determination mode. In the Viterbi decoder of an embodiment of the present invention, desribed below, status memory unit(SMU) 134 is included instead of PMU 3 (see FIG. 1)of an example of magneto-opticdisc apparatus described above.

A Viterbi determination mode can detect correct phase error when ststus data is produced adequetly. Thus a Viterbi determination mode has the same merits and demerits as Viterbi decoding process. Namely, a Viterbi determination mode is not so affected by white noise, DC off-set, low frequent component and asymmmetry as other modes. And, phase margin about phase error detection timing of a Viterbi determination mode is larger than other modes. So a Viterbi determination mode is suitable for a tracking mode.

On the other hand, when a burst error generates with a large defect on the record medium, incorrect phase error detection timing is generated largely by a Viterbi determination mode. In this case, phase errors can not be detected correctly, and consequently, PLL caused to become unlocked easily. Added to it, PLL's loop domain is restricted because of a delay time caused by the operation of the Viterbi decoder.

Further, a Viterbi determinantion mode is not be used before the Viterbi decoder begins to operate normally, because a Viterbi determination mode is to be operated in the situation that the Viterbi decoder is operating normally. Thus, a Viterbi determination mode can not be used as an aquisition mode.

Next, in an MSB determination mode, phase errors are detected with the timing in which turn overs of MSB (Most Significant Bit) of the reproduced signal value generates. Generally, the reproduced signal value is sampled by the A/D converter from reproduced signal in dynamic range of for example 6 or 8 bits. When MSB is '1' at one time point, the reproduced signal value z[k] at that time point is more than half of dynamic range. On the other hand, when MSB is '0' at one time point, the reproduced signal value z[k] at that time point is less than half of dynamic range.

Thus, an MSB determination mode is not dependent on the operation of the Viterbi decoder. Therfore, it is probable that phase error will be detected correctly even when a Vitabi decoding process goes not correctly caused by for example burst error. And, an MSB determination mode can be used as an aquisition mode.

On the other hand, since in an MSB determination mode, phase error detection timing is obtained with the change of signal level of reproduced signal, an MSB determination mode is easily affected by white noise, DC off-set, low frequent component and asymmmetry etc. Consequently, it is probable that phase error can not be detected correctly when the signal quality of reproduced sinal.

In addition, phase margin about phase error detection timing of a MSB determination mode is not so large as a Viterbi determination mode. So, an MSB determination mode is not so suitable for a tracking mode as a Viterbi determination mode.

Further, when an MSB determination mode operates as an aquisition mode, phase error detection timing is not so frequently as a frequency lock mode desribed afterward. Consequently, when an MSB determination mode is used as an aquisition mode, it needs more time to cause a PLL to be locked than when a frequency lock mode is used.

Next, in a frequency lock mode, phase errors are detected with the 2T signal. The error detection timing is obtained in shorter intervals with the 2T signal than with the reproduced RF signal reproduced from the data field. Then, a PLL is caused to be locked in short period in a frequency lock mode, therefore, a frequency lock mode is suitable for an aquisition mode.

On the other hand, a frequency lock mode can be operated so far as 2T signal is reproduced from VFO field is being supplied, then, periodorarea of record medium in which a frequency lock mode can be operated is restrited.

Considering about merits and demerits of these three modes described above, a PLL can be caused to be locked more stably by a method including switching process. For example, a frequency lock mode is used as an aquisitionmode, and a Viterbi determination mode is used as a tracking mode, and these two modes are switched in adequate timing.

Figure 14:
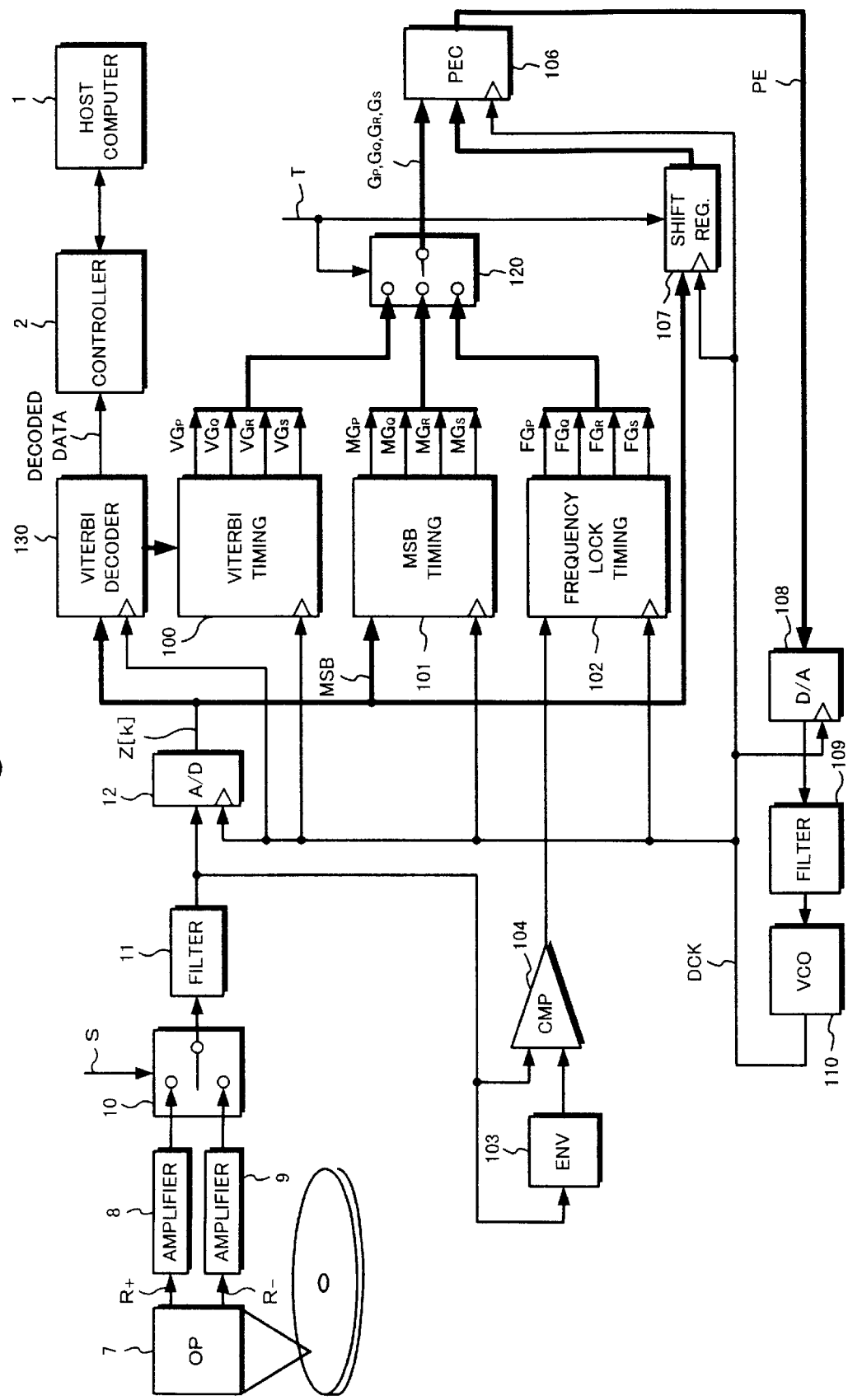
FIG. 14 is a block diagram showing the overall structure of an embodiment of the present invention.

Next, an embodiment of the present invention in which swicthing process will be described with reference to FIG. 14. In an embodiment of the present invention, the present invention is adopted to a magneto-optic disc. In FIG. 14, similar portions to those in FIG. 1 are denoted by similar reference numerals. The structures of the recording system and a servo system (not shown) are the same as those in FIG.

An optical pickup 7, an amplifier 8 and 9, a selection switch 10 and a filter portion 11 are the same as those in FIG. 1. And, controller 2 is also supplied read clock pulses DCK, and operating timing is to be in accordance with read clock pulses DCK, though it is not shown in FIG. 14.

Reproduced signal is processed in predetermined manner that includes equalization by the filter portion 11. And the output of filter portion 11 is supplied to A/D converter 12, envelope detector 103 and comparator 104. A/D converter 12 is further supplied read clock pulses DCK from VCO 110, and A/D converter 12 samples reproduced signal values z[k] from the output of filter portion 11 in the dynamic range of for example 8 bits. And, the reproduced signal value s z[k] sampled by A/D converter 12 is supplied to Viterbi decoder 130 and shift register 107. On the other hand, an MSB of reproduced signal values z[k] is supplied to the MSB timing generating circuit 101 that generates the phase error detection timing for an MSB determination mode.

Next, envelope detector 103 performs an envelope detection with the output of filter portion 11 so as to detect a slice level to convert the reproduced ill signal to two value singanl, and detected slice level is supplied to the comparator 104. A comparator 104 convert the reproduced signal to two-value signal, referring to the slice level supplied. The two-value singanl is supplied to the frequency lock mode timing generating circuit 102 from the comparator 104 that generates the phase error detection timing for a frequency lock mode timing.

The Viterbi decoder 130 produces status data by SMU 134 with supplied reproduced signal values, and produces decoded data by merge block 135 with produced status data. The decoded data is supplied to controller 2. And, the status data is also supplied to the Viterbi timing generating circuit 100 that generates the phase error detection timing for Viterbi determination mode.

The Viterbi timing generating circuit 100 detects phase error detecting timing for a Viterbi determinant mode with the status data supplied from the SMU 134(this process will be described later). And, the Viterbi timing generating circuit 100 generates sampling pulse with predetermined width $VG_p$, $VG_q$, $VG_r$ and $VG_s$.

On the other hand, the MSB timing generating circuit 101 detects phase error detecting timing for an MSB determination mode with the status data supplied from A/D converter 12 (this process will be described afterward). And, the MSB timing generating circuit 101 generates sampling pulse with predetermined width $MG_p$, $MG_q$, $MG_r$ and $MG_s$ with detected timing.

Next, the frequency lock mode timing generating circuit 102 detects phase error detecting timing for a frequency lock mode with the status data supplied from A/D converter 12(this process will be described later). And, the frequency lock mode timing generating circuit 102 generates sampling pulse with predetermined width $FG_p$, $FG_q$, $FG_r$ and $FG_s$ with detected timing.

These three kinds of sampling pulses generated by the Viterbi timing generating circuit 100, the MSB timing generating circuit 101 and the frequency lock mode timing generating circuit 102 respectively are supplied to a sampling pulse selecting switch 120. The sampling pulse selecting switch 120 is further supplied a mode selecting signal T. And, the sampling pulse selecting switch 120 selects one kind of pulse from these three kinds of sampling pulses following the mode selecting signal T. Selected sampling pulse GP, GQ, GR and GS is supplied to the phase error calculating portion (PEC) 106. In addition, the mode selecting signal T is generated by predetermined means that is for example included in controller 2.

Next, the shift register 107 delays the reproduced siganal values z[k] supplied from A/D converter 12 for predetermined period, so as to compensate sampling pulse GP, GQ, GR and GS for delay time of them compared to the reproduced siganal values z[k]. The delay time is due to the operation of the Viterbi timing generating circuit 100, the MSB timing generating circuit 101 or the frequency lock mode timing generating circuit 102. Therfore, predetermined period for which the shift register 107 delays z[k] changes correspnding to selected mode. Then the mode selecting singal T is supplied to the shift register 107, and the compensation perfomed by shift register 107 follows the mode selecting singal T. And, the shift register 107 supplies delayed sampling pulse to PEC 106.

The PEC106 samples from the reproduced siganal values z[k] following the sampling pulse GP, GQ, GR and GS that are supplied from the shift register 107. And, the PEC106 calculates in the manner described below with sampled value, so as to generate phase error signal PE.

The phase error signal PE is supplied to D/A converter 108, and D/A converter 108 performs D/A conversion on PE. The output of D/A converter 108 is supplied to VCO 110 after passing the filter 109. Frequency of the VCO 110 is controlled by the phase error signal PE, consequently, the read clock pulses D CK generates.

As described above, it is necessary that the Viterbi decoder that generates status data is used for a Viterbi determination mode to be performed. As a preparation for description about the Viterbi decoder 130 that generates status data, a status transition diagram is described.

Figure 15:
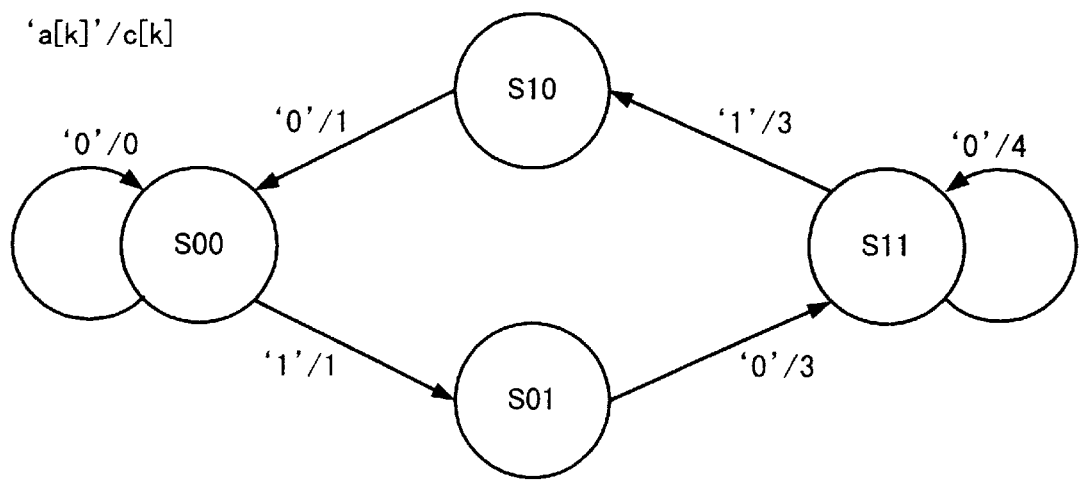
FIG. 15 is a schematic diagram showing an example of a status transition diagram of a four-value four-status Viterbi decoding method in a different denoting method from that shown in FIG. 7.

In the four-value four-status Viterbi decoding method, since four statuses can be represented with two-bit, two-bit data can be used as status data values. Thus, S0, S1, S2, and S3 in FIG. 7 can be denoted by two-bit status data values 00, 01, 11, and 10, respectively. In the following description, S0, S1, S2, and S3 in FIG. 7 are denoted by S00, S01, S11, and S10, respectively. In this case, a status transition diagram shown in FIG. 15 is used in the four-value four-status Viterbi decoding method instead of the status transition diagram shown in FIG. 7.

In the following description, a standardized waveform equalizing characteristic PR(1, 2, 1) is used instead of the above-described waveform equalizing characteristic PR(B, 2A, B). Thus, reproduced signal values c[k] calculated without consideration of values of identification points (namely, noise) are denoted by 0, 1, 3, and 4 instead of −A−B, −A, A, and A+B in FIG. 7.

Figure 16:
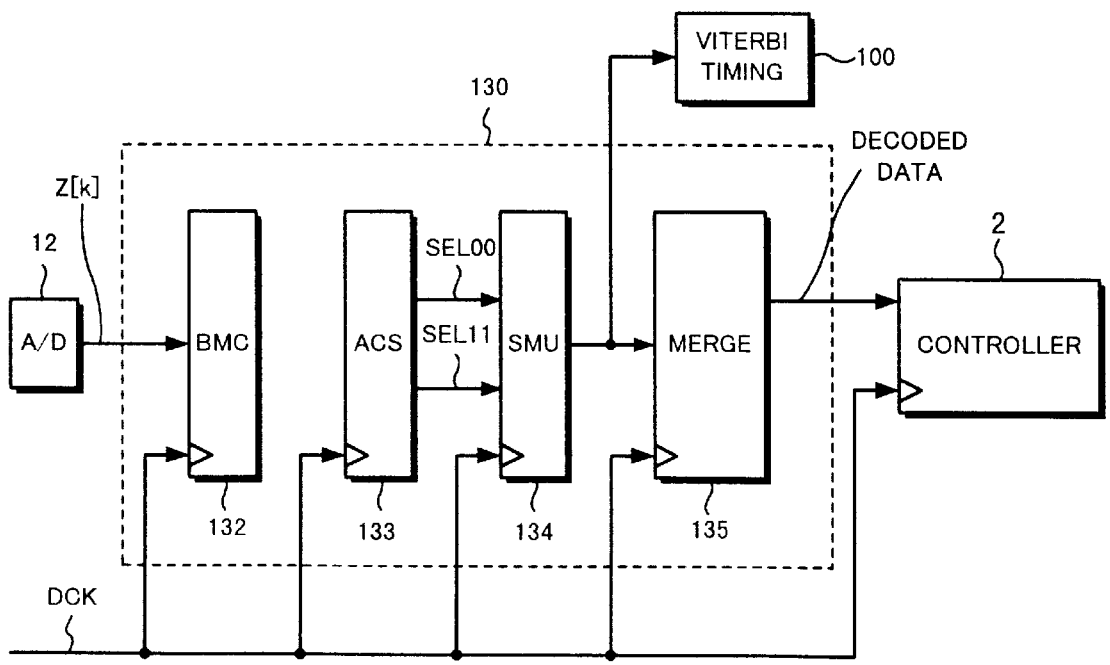
FIG. 16 is a block diagram showing an example of a Viterbi decoder structure equipped an embodiment of the present invention.
Figure 17:
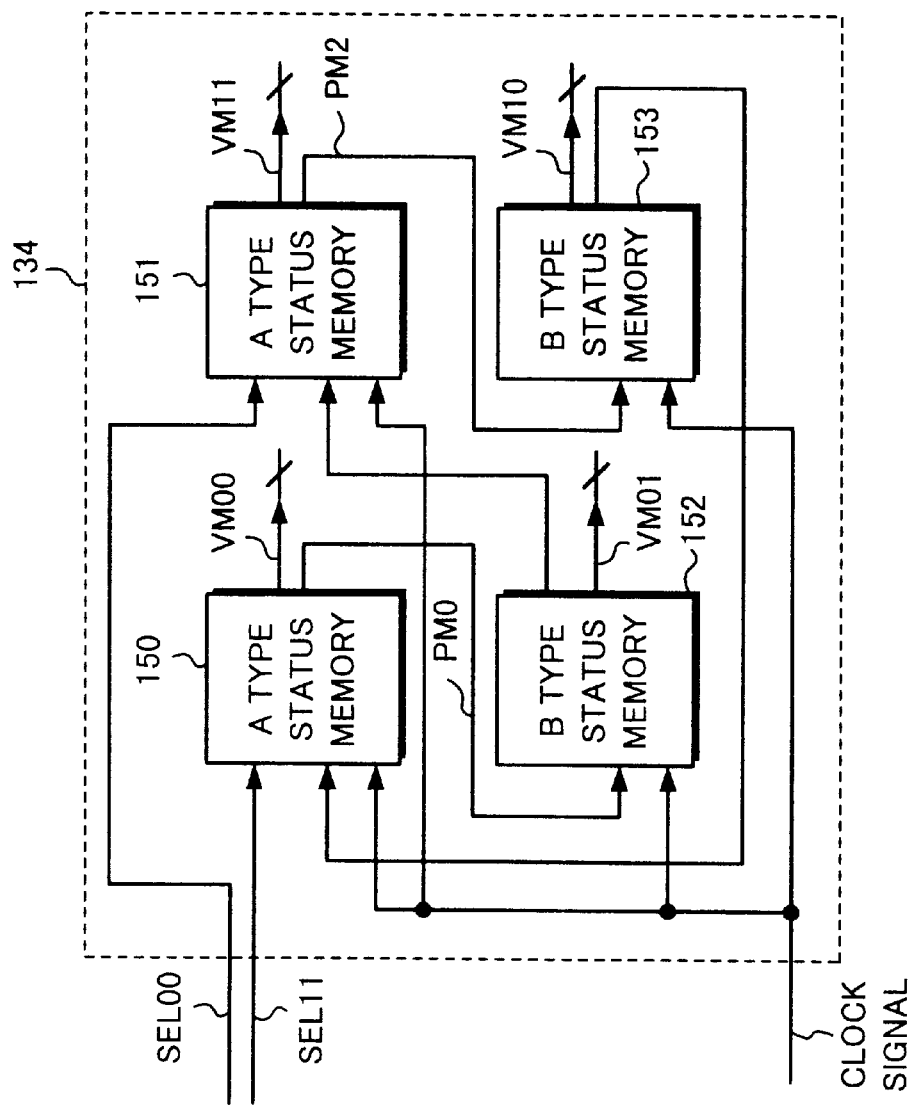
FIG. 17 is a block diagram showing an example of the structure of a status memory unit (SMU) according to an embodiment of the present invention.

Next, with reference to FIG. 16, the structure of the Viterbi decoder 130 will be described. The Viterbi decoder 130 includes a BMC 132, an ACS 133, an SMU 134, and a merge block 135. As the BMC 132 and the ACS 133, for example, BMC 20 and ACS 21 can be used respectively. And, selection signal generated by ACS 133 is described SEL00 and SEL11 in FIG. 16.

The SMU 134 generates status data that represents status transition with the selection signal S00 and S11 in a manner described afterward. And the status data is supplied to the merge block 135. The merge block 135 generates decoded data with the status data supplied from the SMU 134 in a manner described afterward.

Figure 18:
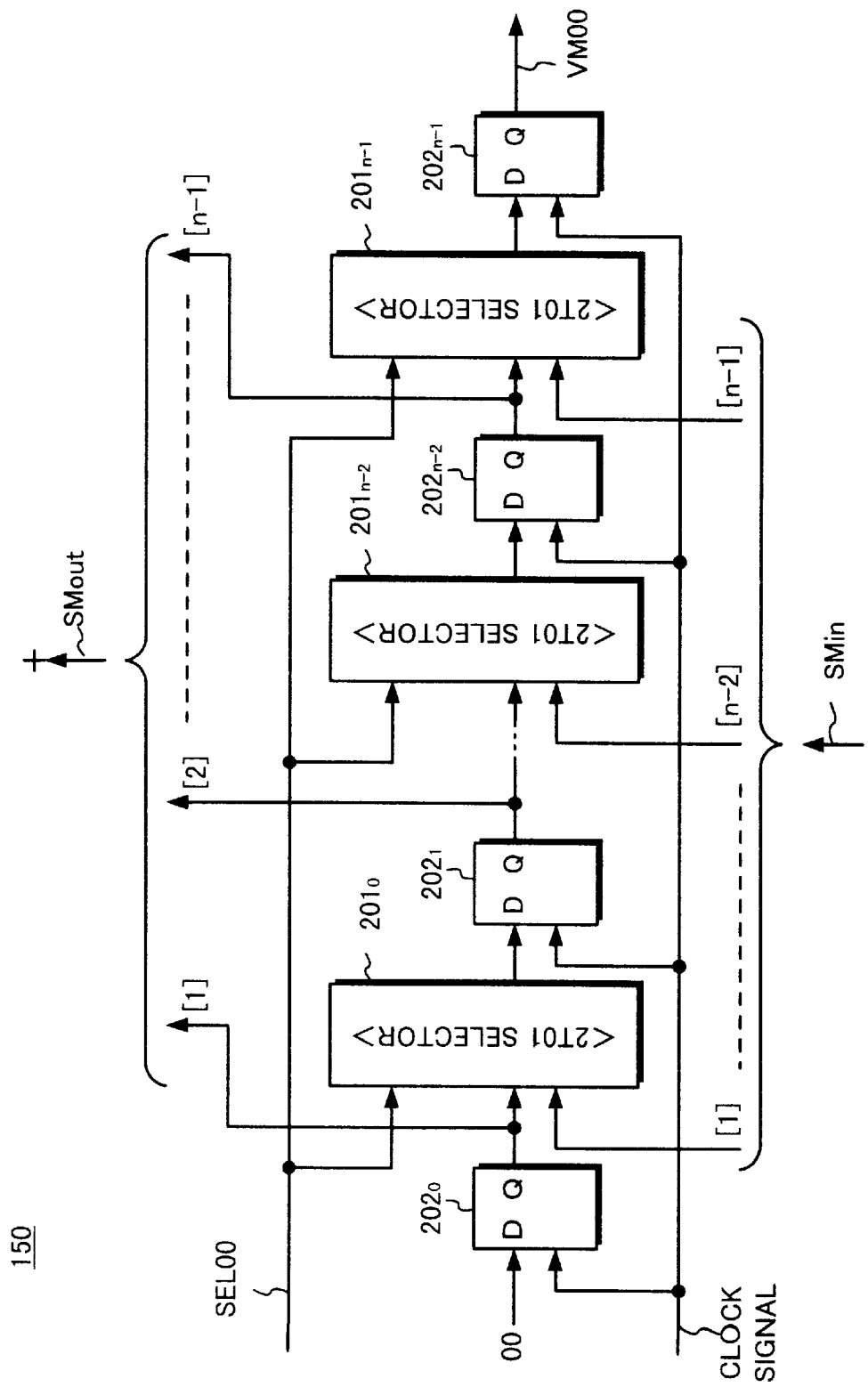
FIG. 18 is a block diagram for explaining the structure of a part of the SMU shown in FIG. 17.

Next, with reference to FIG. 18, the A type status memory 150 corresponding to the status S00 will be described. The A type status memory 150 has n processing stages. In other words, the A type status memory 150 has n selectors $201_0 \ldots 201_{n-1}$ and n registers $202_0 \ldots 202_{n-1}$ that are alternately connected. The selection signal SEL00 is supplied to the selectors $201_0$ to $201_{n-1}$. As described above, status data that is taken over from the B type status memory 153 that corresponds to the status S10 is supplied as SMin of n bits to each selector. Status data that is taken over to the B type status memory 152 that corresponds to the status S01 is output as SMout composed of (n−1) status data values to each register. In addition, clock pulses are supplied to the registers $202_0$ to $202_{n-1}$.

Next, the operation of each selector will be described. As shown in FIG. 15, statuses that change to the status S00 (namely, statuses one clock pulse prior) are S00 and S10. When a status one clock pulse prior is S00, a status transition where the self status is taken over takes place. Thus, "00" is input as the latest status data value of the status data values (as the serial shifting operation) to the selector $201_0$ on the first stage. In addition, the latest status data value SMin[1] of the status data values received from the B type status memory 153 is supplied as the parallel loading operation to the selector $201_0$. The selector $201_0$ supplies one of the two status data values to the register $202_0$ on the next stage corresponding to the selection signal SEL00.

Each of the selectors $201_1$ to $201_{n-1}$ on the second and later stages receives one status data value from the B type status memory 153 that corresponds to the status S10 as the parallel loading operation and one status data value from the register on the preceding stage as the serial shifting operation. Each of the selectors $201_1$ to $201_{n-1}$ supplies a status data value that is determined as the maximum likelihood corresponding to the selection signal SEL00 to the register on the next stage. Since all the selectors $201_0$ to $201_{n-1}$ operate corresponding to the same selection signal SEL00, a status data value as the maximum likelihood status data value selected by the ACS 133 is taken over.

In addition, the registers $202_0$ to $202_{n-1}$ obtain the supplied status data values corresponding to the clock pulses and update the stored status data values. Output data values of the individual registers are supplied to status memories corresponding to statuses that are changed one clock period later. In other words, since the status S00 changes to the same status S00, output data values of the registers are supplied to the selector on the next stage as the serial shifting operation. In addition, the output data values of the registers are supplied as the parallel loading operation to the B type status memory 152 that corresponds to the status S01. The register $202_{n-1}$ on the last stage outputs a status data value VM00.

The structure of the A type status memory 151 that corresponds to the status S11 is the same as the structure of the A type status memory 150. However, a status data value is supplied from the B type status memory 152 that corresponds to the status S01 to the A type status memory 151 as the parallel loading operation corresponding to the status transition S01→S11 shown in FIG. 15. In addition, a status data value is supplied from the A type status memory 151 to the B type status memory 153 that corresponds to the status S10 as the parallel loading operation corresponding to the status transition S11 S10 shown in FIG. 15.

Figure 19:
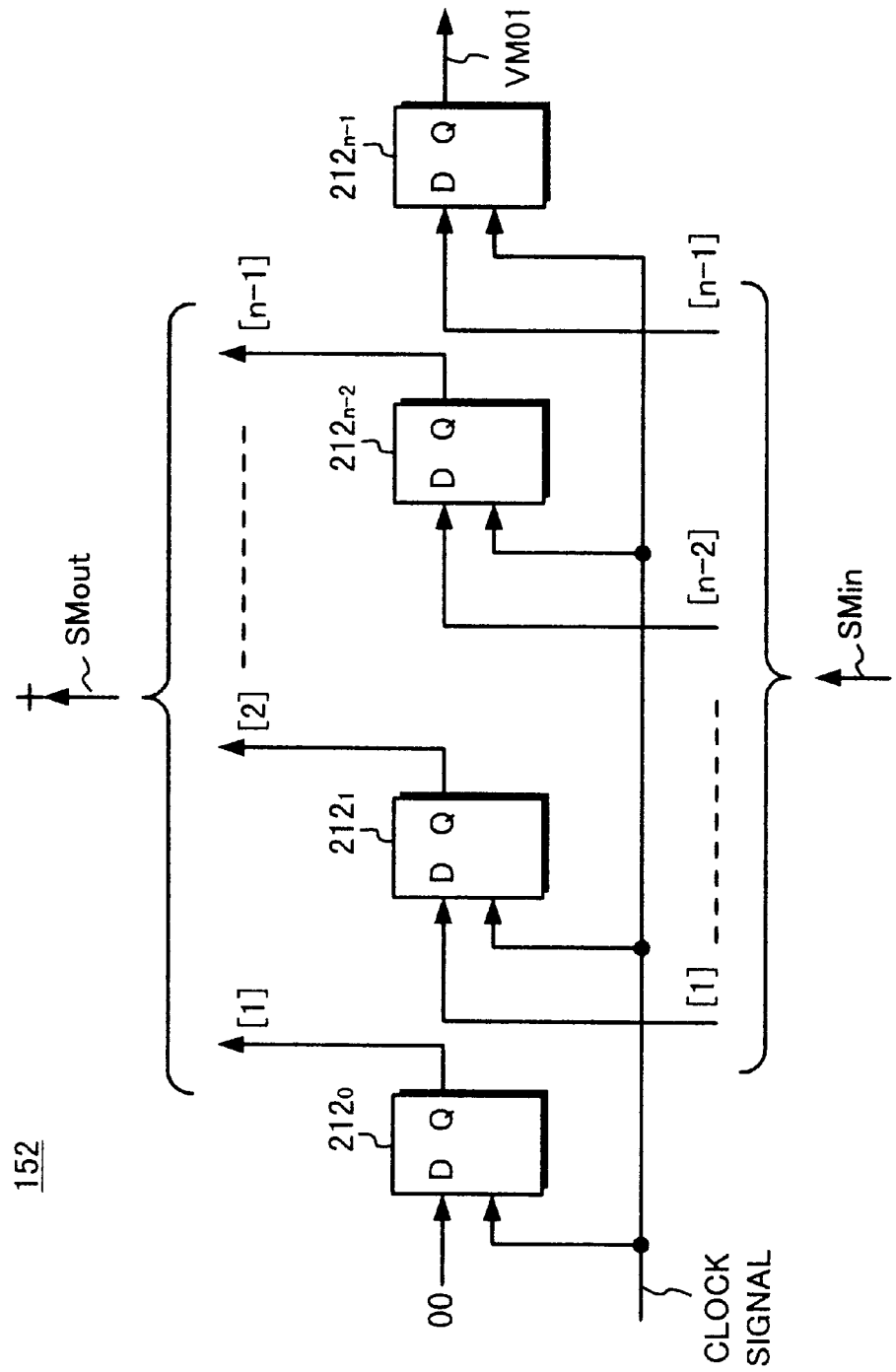
FIG. 19 is a block diagram for explaining the structure of another part of the SMU shown in FIG. 17.

Next, with reference to FIG. 19, the B type status memory 152 that corresponds to the status S01 will be described. The B type status memory 152 corresponds to a status that does not take over the self status and that has one status transition one clock period later. Thus, the B type status memory 152 neither performs the serial shifting operation, nor has selectors. In other words, the B type status memory 152 is composed of n registers $212_0, 212_1, \ldots, 212_{n-1}$. The clock pulses are supplied to the n registers $212_0, 212_1, \ldots, 212_{n-1}$ so as to match the operation timings thereof.

Status data values that are taken over from the A type status memory 150 that corresponds to the status S00 are supplied as SMin composed of (n−1) status data values to the registers $212_0, 212_1, 212_{n-1}$. However, "00" is always input to the register $212_0$ on the first processing stage corresponding to clock pulses. This operation corresponds to the situation that the latest status that changes to S01 is always S00 as shown in FIG. 14. The registers $212_0$ to $212_{n-1}$ store status data values corresponding to the clock pulses and thereby update the stored status data values. In addition, output data values of the registers $212_0$ to $212_{n-1}$ are supplied as status data SMout composed of (n−1) status data values to the A type status memory 151 that corresponds to the status S11 that takes place one clock period later. The register $212_{n-1}$ on the last stage outputs a status data value VM01.

The structure of the B type status memory 153 that corresponds to the status S10 is the same as that of the B type status memory 152. However, a status data value is supplied from the A type status memory 151 that corresponds to the status S11 to the B type status memory 153 as the parallel loading operation corresponding to the status transition S11→S10 shown in FIG. 15. In addition, a status data value is supplied from the B type status memory 153 to the A type status memory 150 that corresponds to the status S00 as the parallel loading operation corresponding to the status transition S10 S00 shown in FIG. 15.

In the Viterbi decoding method, the status data values VM00, VM11, VM01, and VM10 that the individual status memories generate matches each other when memory length n of ststus memory is enough large. In this case, arbitray one of these four status data values can be output to following procssor. The memory length n should be determined with some paerameters, for example C/N of reproduced signal or property of frequency of reproduced signal.

Next, a merge block 135 will be described. The merge block 135 memorize a table on a decoding matrics shown in FIG. 20 in for example ROM (Read Only Memory) included inside. And, the merge block 135 generates decoded data with status data with refering to the table. The status transition diagram shown in FIG. 15 represents that a decoded data value corresponds to two successive status data values. In other words, a decoded data value on the time k+n is to be determined with a status data value VM that is generated corresponging to reproduced signal value z[k], and status data value VM corresponging to reproduced signal value z[k−1] preceding that status data value VM.

For example, when the value of VM is "01" and the value of VMD is "00", FIG. 15 shows that a decoded data value is "1". The table on decoding matrics shown in FIG. 20 is made with the correspondence between decoded data value and status data value such as above example is shown in FIG. 20.

Next, the generation of phase error detection timing by the Viterbi timing generating circuit 100 will be described with reference to FIG. 21.

FIGS. 21A, 21B, and 21C show sampling points of the reproduced RF signal supplied to the A/D converter 12 corresponding to the read clock signal DCK. In FIGS. 21A, 21B, and 21C, sampling points are denoted by black points. In addition, statuses selected corresponding to individual sampling points =are represented on x axis of each graph. FIG. 21A shows the case that there is no phase error. FIG. 21B shows the case that the phase of the read clock signal DCK advances against the phase of the reproduced RF signal. FIG. 21C shows the case that the phase of the read clock signal DCK delays against the phase of the reproduced RF signal. In FIGS. 21A, 21B, and 21C, dashed lines are drawn every two read clock pulses for easy representation of a phase error.

The status transition generates following the status transition diagram shown in FIG. 15. In FIG. 15 at time point j corresponding to the read clock signal DCK, when a status transition S11→S10 takes place, it is clear that a status transition S10→S00 takes place at the next time point j+1. In this case, the reproduced signal value is within an allowable error of noise and z[j]=3 and z[j+1]=1. Thus, with the status data, it can be determined that the time point j corresponds to a trailing edge of the reproduced RF signal.

Next, with reference to FIG. 21, this detecting method will be practically described. In FIGS. 21A, 21B, and 21C, P represents a sampling value at a leading edge of a reproduced signal. In other words, since the reproduced signal value P in the status S00 is within an allowable error of noise and "1", a status transition to the status S01 takes place one read clock period later. The sampling value Q of the reproduced signal value in the status S01 is within an allowable error of noise and "3", a status transition to the status S11 takes placeone clock period later. Thus, it is clear that the signal level of the reproduced RF signal goes high in the period between the sampling points P and Q.

On the other hand, in FIG. 15, at time point j when a status transition S11→S10 takes place, it is clear that a status transition S10→S00 takes place at the next time point j+1. In this case, the reproduced signal value is within an allowable error of noise and z[j]=3 and z[j+1]=1. Thus, with the status data, it can be determined that the time point j corresponds to a trailing edge of the reproduced RF signal.

Next, with reference to FIG. 21, this detecting method will be practically described. In FIGS. 21A, 21B, and 21C, R represents a sampling value at a trailing edge of the reproduced RF signal. Since the reproduced signal value R in the status S11 is within an allowable error of noise and "3", a status transition S11→S10 takes place one read clock period later. Since the sampling value Q as the reproduced signal value in the status S10 is within an allowable error of noise and "1", a status transition S10→S00 takes place one read clock period later. Thus, it is clear that the signal state of the reproduced RF signal goes low in the period between the sampling point R and the sampling points. As a result, the relation between sampling points P, Q, R, and S and status transitions is represented as follows.

P: Reproduced signal value at leading edge
(status transition S00 +S01)

Q: Reproduced signal value one read clock period after leading edge (status transition S01→S11)

R: Reproduced signal value at trailing edge
(status transition S11→S10)

S: Reproduced signal value one clock period later after trailing edge (status transition S10→S00)

When the phase of the read clock signal DCK precisely matches the phase of the reproduced RF signal as shown in FIG. 21A, referring to FIG. 15, it is clear that the values P and S are within an allowable error of noise and equal to "1" as an identification point value. In addition, it is also clear that the values Q and R are within an allowable error of noise and equal to "3" as an identification point value. Thus, the relations of P=S and Q=R are obtained.

On the other hand, as shown in FIG. 21B, when the phase of the read clock signal DCK advances against the phase of the reproduced RF signal, sampling points are earlier than those in FIG. 21A. Thus, the values P and Q in FIG. 21B are smaller than those in FIG. 21A. In contrast, the values R and S in FIG. 21B are larger than those in FIG. 21A. Consequently, since P<S and Q<R, the relations of P−S <0 and Q−R<0 are satisfied.

On the other hand, when the phase of the read clock signal DCK delays against the phase of the reproduced RF signal, sampling points are later than those in FIG. 24A. Thus, the values P and Q in FIG. 21C are larger than those in FIG. 21A. In contrast, the values R and S in FIG. 21C are smaller than those in FIG. 21A. Consequently, since P>S and Q>R, the relations of P−S>0 and Q−R>0 are satisfied.

Then, the value [(P−S)+(Q−R)] can be used as a phase error PE with sampled values of P, Q. R and S. P, Q, R and S are sampled following the sampling pulse $VG_p$, $VG_q$, $VG_r$ and $VG_s$ shown in FIG. 21D, FIG. 21E, FIG. 21F and FIG. 21G. $VG_p$, $VG_q$, $VG_r$ and $VG_s$ are generated by the Viterbi timing generating circuit 100 generates as described above. When the phase of the read clock signal DCK advances against the phase of the reproduced RF signal, PE<0, And, when the phase of the read clock signal DCK delays against the phase of the reproduced RF signal, PE>0. In a Viterbi definition mode, values of the phase error PE is constanly calculated. In other word, values of PE is renewed as the sampling pulse is generated.

Next, an MSB determination mode will be described with refering to FIG. 22. FIG. 22A shows an example of the reproduced RF signal supplied to the A/D converter 12. In FIG. 22A, sampling points are denoted by black points. FIG. 22A shows the case that there is no phase error. And, a line parallel to x-axis representing the half of dynamic range is added.

An MSB of reproduced signal value is '1'/'0' respectively, corresponding to the reproduced RF signal is upper/lower than the half of the dynamic range. And the MSB of reproduced signal value is supplied to the MSB timing generating circuit 101. FIG. 22B shows the MSB that is correspond to the example of the reproduced RF signal shown in FIG. 22A.

Described above, in the four-value four-status Viterbi decoding method, the reproduced signal values are within an allowable error of noise and equal to one of the value "0", "1", "3" and "4". The reproduced signal values are near "0" or "1", an MSB is '0', because "0" and "1" are corresponding to the part of the reproduced signal that is lower than the half of the dynamic range. On the other hand, the reproduced signal values are near "3" or "4", an MSB is '1', because "3" and "4" are corresponding to the part of the reproduced signal that is upper than half of the dynamic range. Consequently, leading edges and trailing edges are to be enhanced by detecting bit inversion of an MSB, described below.

MSB inverts on a time point in which reproduced singal value changes from a value near "1" to a value near "3", shown in FIG. 22A and in FIG. 22B. And, the time point that is one clock preceeding to the MSB inversion is to be recognized as a sampling value on leading edge P. The value of P is near "1". In order to sample the value of P, the sampling pulse $MG_p$ that has about one clock width from leading edge (see FIG. 22C).

Further, the sampling value on the time point that is one clock delayed against leading edge is to be recognized as a sampling value Q. The value of Q is near "3". In order to sample the value of Q, the sampling pulse $MG_q$ that has about one clock width and that delays one clock against the sampling pulse $MG_p$ (see FIG. 22D).

On the other hand, MSB inverts on a time point in which reproduced singal value changes from a value near "3" to a value near "1". And, the time point that is one clock preceeding to MSB inversion is to be recognized as a sampling value on trailing edge R. The value of R is near "3". In order to sample the value of R, the sampling pulse MG R that has about one clock width from trailing edge (see FIG. 22E).

Further, the sampling value on the time point that is one clock delayed against leading edge is to be recognized as a sampling value S. The value of R is near "3". In order to sample the value of S, the sampling pulse MGS that has about one clock width and that delays one clock against the sampling pulse $MG_r$ (see FIG. 22F).

In case there is no phase error, the value of P and Q are supposed to identical within an allowable error of noise, because the values of P and Q are both near "1", described above. And, in case there is no phase error, the value of R and S are also supposed to identical within an allowable error of noise, because the values of R and S are both near "3", described above.

Thus, phase error can be represented with difference between P and S, and difference between Q and R. For example, the value [(P−S)+(Q−R)] can be used as phase error PE.

An MSB determination mode described above is perfomed with reproduced RF signal, then it is used as tracking mode. On the other hand, an MSB determination mode can be performed with 2T signal reproduced from the VFO field, because, it can be performed with some reproduced signal that has a certain regularity. Then, an MSB determination mode can be used as an aquisition mode with for example 2T signal.

Next, a frequency lock mode will be described with reference to FIG. 23. The frequency lock mode timing generating circuit 102 detects the signal part that is reproduced from the sector mark SM described above from the reproduced signal supplied from comparator 104. And, the frequency lock mode timing generating circuit 102 enhance the period in which 2T signal reproduced from the VFO field, in a methd, for example bycountering a number of a system clock with starting from the sector mark SM. The system clock is generated by for example crystal oscillator.

And, the frequency lock mode timing generating circuit 102 generates sampling pulses $FG_p$, $FG_q$, $FG_r$ and $FG_s$ with predetermied width in the timing following system clock, shown in FIG. 23D, FIG. 23E, FIG. 23F and FIG. 23G under a supposition that correct 2T signal is constantly supplied. In a frequency lock mode it is supposed to be Q=R and P=S within an allowable error of noise, in case there is no phase error, similar to other modes described above. The refore, the value for example [(P−S)+(Q−R)] can be used as a phase error signal PE.

On the other hand, VFO3 described above is the area in which 2T signal is recorded magneto-optically. And, 2T pattern is recoded preceeding the record of user's data and so on, with precoded output {b k } (see FIG. 23B) based on recorded data {a k } (see FIG. 23A). A frequency lock mode can be performed with the 2T pattern recoded above.

A set of four pulses that represents the phase error detection timings in any one of a Viterbi determination mode, an MSB mode and a frequency lock mode. And, in any one of these three modes, a value of a phase error detection signal PE is calculated in a common manner such as the formula (40) described below.

$$PE=[(P-S)+(Q-R)] \quad (40)$$

Therefore, PEC 106 is to perform in a same mannner (it will be described afterword), without concerning the set of the sampling that is selected as GP, GQ, GR and GS. Then, PEC106 sumples the values of P, Q, R and S from the output of shift register following GP, GQ, GR and GS and calculates with the values following the fomula (40), and further generates phase error signal PE.

Figure 24:
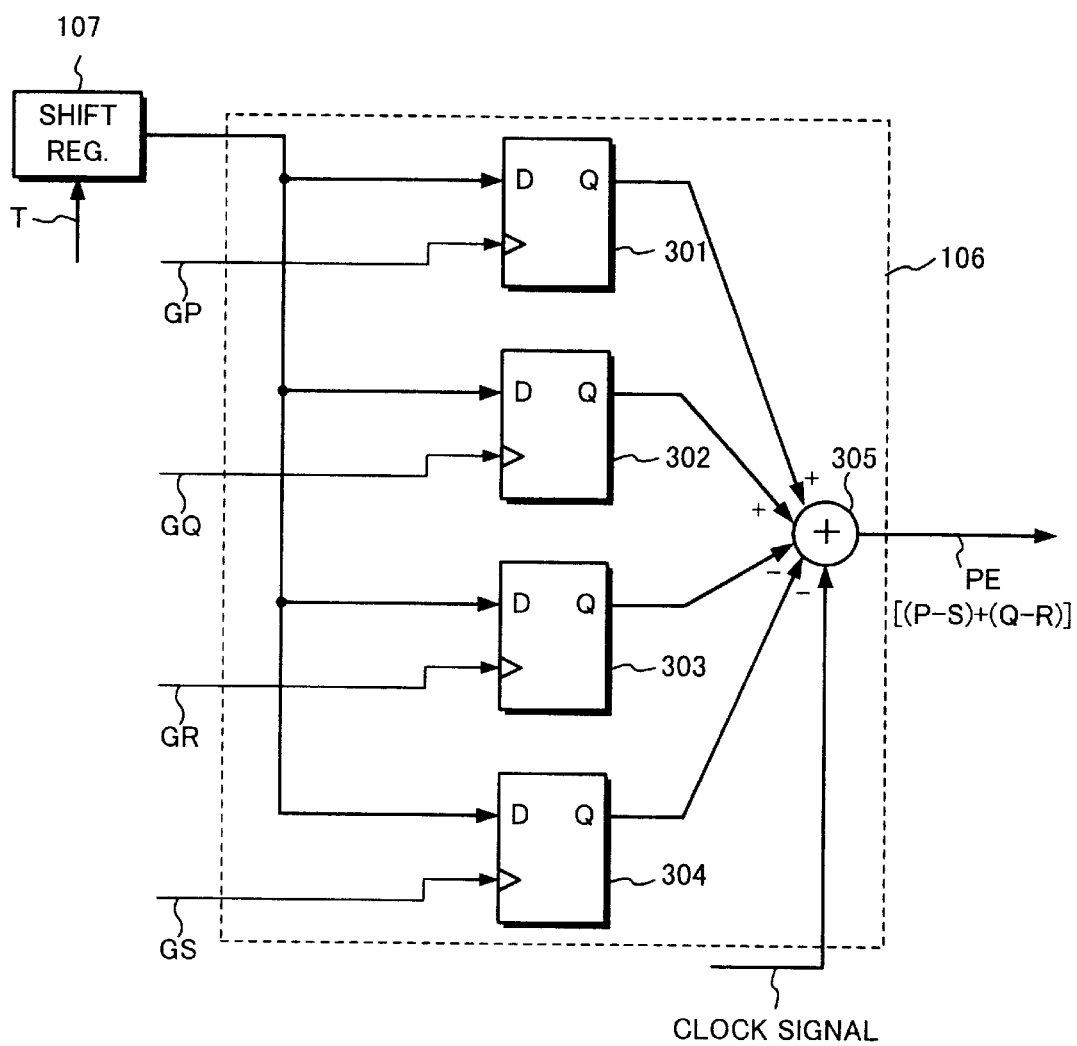
FIG. 24 is a block diagram for explaining the phase error calculating portion in an embodiment of the present invention.

Next, the PEC 106 will be described with reference to FIG. 24. The PEC 106 includes four registers 301, 302, 303 and 304, and a calculating portion 305 that performs a subtraction and an addition corresponding to values received from the registers 301, 302, 303, and 304.

The registers 301, 302, 303, and 304 are respectively supplied GP, GQ, GR and GS. And, the registers 301, 302, 303, and 304 properly latch the values P, Q, R, and S, respectively, following $G_P$, GQ, GR and GS. On the other hand, the clock signal is supplied to the registers 301, 302, 303, and 304.

The output of shift register 107 and the set of sampling pulses GP, GQ, GR and GS are supplied in the timing following the clock. Thus, it is not essntial to supply the clock signal to the registers 301, 302, 303, and 304.

However, the clock signal is supplied to these registers against some errors on timing in which the output of shift register 107 or the set of sampling pulses are suppled. So, when the probability of generation of errors on timing described above is enough small, the structure that does not supplies clock signal to these registers is to be used.

With the values P, Q, R, and S, the calculating portion 305 calculates the value of the phase error signal PE corresponding to Formula (40). The calculating portion 305 always calculates the value of the phase error signal PE while receiving the reproduced RF signal.

Figure 25:
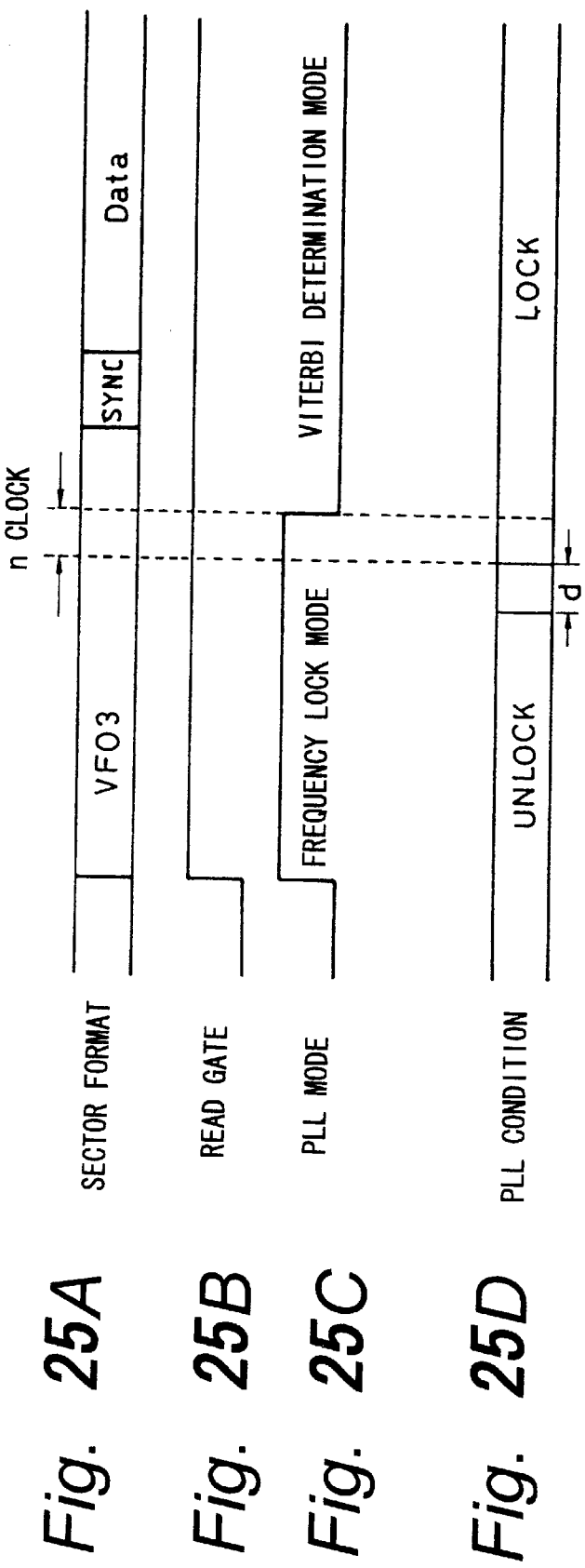
FIG. 25A–25D are block diagrams for explaining an example of the timing in which the switching from an aquisition mode to a tracking mode.

Next, an example of switcing will be described with reference to FIG. 25. In the example described in FIG. 25, a frequency mode is used as an a quisition mode, and, a Viterbi determination mode is used as a tracking mode. This switchig method is written switching method(a) in following description. FIG. 25A shows the area which is reproduced in the period the switching method(a) is performed.

In the example of sector format described above with reference to FIG. 3, the top area recorded megneto-optically is the VFO3. Then a read gate that instructs reproduction is caused to rise at the startig point of the VFO3. The read gate is generated by for example controller 2. Paticulary, the rising point of the read gate is corrctly enhanced with predetermined pattern in sector format, such as the sector mark SM described above.

A frequency mode is performed as an aquisition mode with 2T signal reproduced from the VFO3, so as to a PLL is caused to be locked. A period that is needed to become completely locked, is determined with results of experiments or simulation. After the period determined in this way and another period "d" that is added as a margin, a PLL can be regarded to have been locked (see FIG. 25D).

A Viterbi determination mode can be performed as a tracking mode adequetly in the situation that the Viterbi decoder is running normally, described above. An aquisition mode has to be completed in the period in which the VFO3 is being reproduced so as to realize the condition described above.

However, n clock delay time generates because of an operation of the SMU 134. So, status data values generated at the time point on which the period needed to become locked described above has just passed is supposed to be generated with the reproduced signal value sampled in the period in which a PLL has not been locked completely. Thus, it is probable that the status data values described above has some errors.

Then, instead of switching to a Viterbi determination mode at the time point described above, switching to a Viterbi determination mode at n clock later from the time point described above is operated. FIG. 25C shows this switching on modes. The mode selection signal T instracts such switching on modes.

The above description is about the switching method(a). On the other hand, the switching method(b), and the switching method(c) can be performed described below.

the switching method(b): A frequency lock mode is used as an aquisition mode, and an MSB determination mode is used as a tacking mode.

the switching method(c): An MSB determination mode is used as an aquisition mode, and a Viterbi determination mode is used as a tacking mode.

In those switching methods, switching on modes that is similar to the switching method(a) is to be performed. In case the switching method(b) is used, switching to an MSB determination mode at the time point that is the predetermined period delayed against the time point at which a PLL can be regarded to have been locked is performed. And, the predetermined period is determined with a delay time before the generation of an MSB determination mode, and the predetermined period is shorter than n clock. On the other hand, an MSB determination mode has smaller phase margin than a Viterbi determination mode, then in case the switching method(b) is used, there is an inclinatin that the PLL is not so stable on tracking mode as the switching method(a) or the switching method(c).

And, an MSB determination mode needs more time to cause a PLL to be locked than a frequency lock mode, then it is necessary that the VFO field has enough length so as to use the switching method(c).

Next, in case a Viterbi determination mode is performed as a tracking mode such as the switching method(a) or the switching method(c), when PLL become unlocked, there may be incorrect operations on the Viterbi decoder because of for example burst error. Thus, when PLL has become unlocked, incorrect operation the Viterbi decoder is probable to last on following operation, then a PLL is probably going to be unlocked continuously.

Then, a method described below is effective to realize more stable PLL lock. In this method, the switching method (a) or the switching method(c) is used in the period in which reproduction is performs normally, and consequently a Viterbi decoding process is performed adequetly. In this method, further, when a PLL become unlocked in Viterbi determination mode, switching to an MSB determination mode is executed. And, it is also effective that the switching method(a) or the switching method(c) is to be used insted of the switching method(a), after the time point when a PLL become unlocked in Viterbi determination mode.

As described above, as the memory length of the status memories is large, the probability of which status data values VM00, VM11, VM01 and VM10 match each other can be increased. However, as the memory length of status memories is large, the delay time originated in the SMU 134's operation is also large. Thus, it is not practical to excessively increase the memory length of the status memories. Then in real apparatus, it may be take place mismatches of the four status data values VM00, VM11, VM01 and VM10. Against this case, a structure that allows the most adequate status data value to be selected from the four status data values.

The structure described above can be equipped as a prcessing portion following the four status memories. For example, the structure described above can be equipped in SMU 134 at the position following the four status memories. And, the structure described above can be equipped in the merge block 135.

In case the structure described above is not needed because of sufficiently high quality of representation or the structure described above is equipped in the SMU 134, the output of the SMU 134 is supplied to the Viterbi timing generating circuit 100 as shown in FIG. 14. On the other hand, the structure described above is equipped in the merge block 135, the merge block 135 supplies selected reproduced signal value to the Viterbi timing generating circuit 100.

Figure 26:
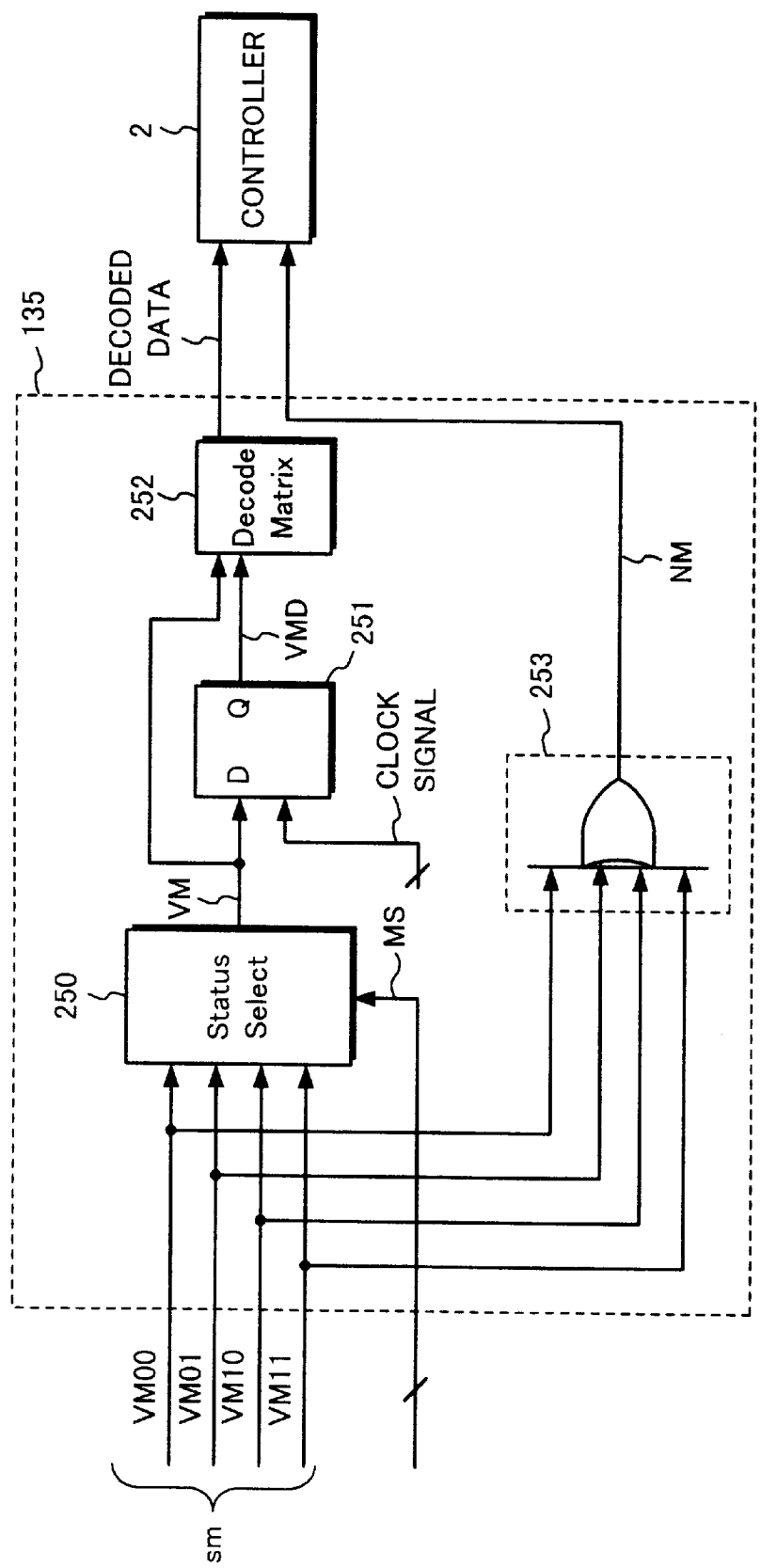
FIG. 26 is a block diagram for showing an example of the structure of merge block in an embodiment of the present invention.

Next, with reference to FIG. 26, a merge block 135 will be described. Referring to FIG. 26, the merge block 135 comprises a status selecting circuit 250, a register 251, a decoding matrix portion 252, and an mismatch detecting circuit 253.

The status selecting circuit 250 references a two-bit signal MS received from the ACS 133, selects the most adequate one of the status data values VM00, VM11, VM01, and VM10, and outputs the selected status data value as VM.

The two-bit singnal MS represents a status transition in which the value of pathmetric is minimum at each time corresponding to clock. Consequently, the probability of which the correctest status data value is selected becomes high.

The VM selected by the structure described above is supplied to the register 251 and the decode matrics portion 252. The register 251 delays the VM for a clock, and this delayed VM (that is referred as VMD) is supplied to the the decode matrics portion 252 =i:: as well as the VM. Thus the decode matrics portion 252 receives the ststus data value VM and the sattus data VMD that has been generated a clock earlier than the VM. The decode matrics portion 252 memorizes the decode matrics table that FIG. 20 shows on for example ROM included inside. And, the decode matrics portion 252 generates decoded data value with the VMD and the VM with reference to the decode matrics.

Next, the mismatch detecting circuit 253 can. bestructured with for example an exclusive-OR circuit. The status data values VM00, VM11, VM01, and VM10 are supplied to the mismatch detecting circuit 253. The mismatch detecting circuit 253 detects a mismatch of these four status data values and outputs the detected result as a mismatch detection signal NM. Unless all the four status data values match each other, the mismatch detection signal NM is to be nable or active. The mismatch detection signal NM can be used to evaluate the quality of decoded data or reproduced signal. Thus, the operating condition of the portion to produce decode data such as the decode matrics portion 252 or the portion to produce a reproduced signl such as the optical pickup 7 and so on.

In case merge block 135 includes the status selecting circuit 250 as shown in FIG. 26, the output of the status selecting circuit 250 is to supplied to the Viterbi timing generating circuit 100 as the ststus data value.

The embodiment of the present invention is applied to a magneto-optic disc apparatus corresponding to four-value four-status Viterbi decoding method. However, it should be noted that the present invention is applied to magneto-optic disc apparatuses corresponding to other types of a Viterbi decoding methods such as a three-value four-status Viterbi decoding method and a seven-value six-status Viterbi decoding method.

In addition, the present invention can be applied to an information reproducing apparatus corresponding to Viterbi decoding method for decoding data that has been read from data recorded on a record medium. In other words, the present invention can be also applied to rewritable discs (such as phase change type disc PD and CD-E (CD-Erasable)), recordable discs (such as CD-R), and read-only discs (such as CD-ROM).

It should be noted that the present invention is not limited to the above-described embodiment. Instead, without departing from the spirit of the present invention, various changes and modifications are available.

As described above, according to the present invention, as an aquisition mode in which a PLL is caused to be locked or a tracking mode in which a PLL is holded to be locked, a Viterbi determination mode, an MSB determination mode and a frequency lock mode are to be used and these three modes are to be switched according to the condition of a PLL.

Thus, demerits of these three modes can be made up and merits of them can be made use of. For example, by using a Viterbi determination mode as a tracking mode after a PLL has been caused to become locked, a Viterbi determination mode's merits to hold a condition in which a PLL has been locked, such as a large phase margine, can be made use of.

Therefore, both an aquisition mode and a tracking mode can be performed adequetly, and consequently, a PLL can always be locked adequetly.

In addition, according to the present invention, when a Viterbi determination mode that is performed as a tracking mode is not operated normally becuse of for example a burst error and consequently a PLL has been unlocked, the probability of which a PLL is to be hold can be high by a controll to switch to an MSB determination mode instead of a Viterbi determination mode.

Having described a specific preferred embodiment of the present invention with reference to the accompanying drawings, it is to be understood that the invention is not limited to that precise embodiment, and that various changes and modifications may be effected therein by one skilled in the art without departing from the scope or the spirit of the invention as defined in the appended claims.

What is claimed is:

1. An information reproducing apparatus for causing a PLL (Phase Locked Loop) to be locked with a signal reproduced from a record medium, causing the PLL to generate a clock signal, and operating a reproducing system corresponding to the clock signal, comprising:

Viterbi decoding means for decoding the reproduced signal corresponding to the Viterbi decoding method;

first timing generating means for generating a first timing signal for detecting a phase error with status data that represents a status transition selected by said Viterbi decoding means;

second timing generating means for generating a second timing signal for detecting a phase error at a timing of the inversion of MSB of a reproduced signal with a predetermined number of bits, the reproduced signal being received from an A/D converter disposed on the preceding stage of said Viterbi decoding means;

third timing generating means for generating a third timing signal for detecting a phase error corresponding to a predetermined signal pattern recorded or formed on the predetermined area of record medium;

switching means for selectively outputting one of the first, second, and third timing signals; and phase error signal generating means for generating a phase error signal for controlling the PLL with the reproduced signal corresponding to the timing signal selected by said switching means.

2. The information reproducing apparatus as set forth in claim 1, further comprising:

delay time compensating means for delaying the reproduced signal so that delay time is compensated with the timing signal selected by said switching means.

3. The information reproducing apparatus as set forth in claim 2, wherein said phase error signal generating means has:

latching means for latching the reproduced signal received from said delaying means with the timing signal selected by said switching means; and phase error calculating means for calculating a phase error with a value latched by said latching means.

4. The information reproducing apparatus as set forth in claim 1, wherein said switching means selects one of the first, second, and third timing signals to be supplied to said phase error signal generating means corresponding to the locking state of the PLL.

5. The information reproducing apparatus as set forth in claim 1, wherein a predetermined signal reproduced from the predetermined area is a 2T signal (where T is a pit period).

6. The information reproducing apparatus as set forth in claim 1, wherein said switching means supplies the third timing signal received from said third timing generating means to said phase error signal generating means in an acquisition mode for causing the PLL to be locked when the PLL has not been locked, and wherein said switching means supplies the first timing signal received from said first timing generating means to said phase error signal generating means in a tracking mode for causing the state of the PLL that has been locked in the acquisition mode to be maintained.

7. The information reproducing apparatus as set forth in claim 1, wherein said switching means supplies the third timing signal received from said third timing generating means to said phase error signal generating means in an acquisition mode for causing the PLL to be locked when the PLL has not been locked, and wherein said switching means supplies the second timing signal received from said second timing generating means to said phase error signal generating means in a tracking mode for causing the state of the PLL that has been locked in the acquisition mode to be maintained.

8. The information reproducing apparatus as set forth in claim 1, wherein said switching means supplies the second timing received from said second timing generating means to said phase error signal generating means in an acquisition mode for causing the PLL to be locked when the PLL has not been locked, and wherein said switching means supplies the first timing signal received from said first timing generating means to said phase error signal generating means in a tracking mode for causing the state of the PLL that has been locked in the acquisition mode to be maintained.

9. The information reproducing apparatus as set forth in claim 1, wherein said switching means supplies the first timing signal received from said first timing generating means to said phase error signal generating means in a tracking mode for causing the state of the PLL that has been locked to be maintained, and wherein said switching means supplies the third timing signal received from said third timing generating means to said phase error signal generating means in the tracking mode when the PLL is unlocked.

10. The information reproducing apparatus as set forth in claim 1, wherein said switching means supplies the first timing signal received from said first timing generating means to said phase error signal generating means in a tracking mode for causing the state of the PLL that has been locked to be maintained, wherein said switching means supplies the third timing signal received from said third timing generating means to said phase error signal generating means in the tracking mode after the PLL has been unlocked, and wherein said switching means supplies the first timing signal received from said first timing generating means to said phase error signal generating means after the PLL has been locked.

11. The information reproducing apparatus as set forth in claim 1, wherein said switching means performs a switching operation of the timing signal while a predetermined area having the predetermined pattern of the record medium is being reproduced.

12. An information reproducing apparatus for causing a PLL to be locked with a signal reproduced from a record medium, causing the PLL to generate a clock signal, and performing a reproducing operation corresponding to the clock signal, comprising:

Viterbi decoding means for decoding the reproduced signal corresponding to Viterbi decoding method;

first timing generating means for generating a first timing signal with status data that represents a status transition selected by said Viterbi decoding means;

second timing generating means for generating a second timing signal corresponding at a timing of the inversion of MSB of the digitized reproduced signal;

switching means for selecting one of the first and second timing signals; and phase error signal generating means for generating a phase error signal for controlling the PLL with the selected timing signal.

13. The information reproducing apparatus as set forth in claim 12, wherein said switching means selects one of the first and second timing signals to be supplied to said phase error signal generating means corresponding to the locking state of the PLL.

14. An information reproducing apparatus for causing a PLL to be locked with a signal reproduced from a record medium, causing the PLL to generate a clock signal, and performing a reproducing operation corresponding to the clock signal, comprising:

Viterbi decoding means for decoding the reproduced signal corresponding to Viterbi decoding method;

first timing generating means for generating a first timing signal with status data that represents a status transition selected by said Viterbi decoding means;

second timing generating means for generating a second timing signal corresponding to a predetermined signal pattern recorded or formed on the record medium;

switching means for selecting one of the first and second timing signals; and phase error signal generating means for generating a phase error signal for controlling the PLL with the selected timing signal.

15. The information reproducing apparatus as set forth in claim 14, wherein said switching means selects one of the first and second timing signals to be supplied to said phase error signal generating means corresponding to the locking state of the PLL.

16. An information reproducing method for causing a PLL (Phase Locked Loop) to be locked with a signal reproduced from a record medium, causing the PLL to generate a clock signal, and operating a reproducing system corresponding to the clock signal, comprising the steps of:

generating a first timing signal with status data that represents a status transition selected by a Viterbi decoder;

generating a second timing signal at a timing of the inversion of MSB of a reproduced signal with a predetermined number of bits sampled, the reproduced signal being received from an A/D converter disposed on the preceding stage of said Viterbi decoder;

generating a third timing signal with a predetermined signal pattern recorded or formed on the record medium;

selectively outputting one of the first, second, and third timing signals; and generating a phase error signal for controlling the PLL with the selected timing signal.

* * * * *